(12) United States Patent
Tsuno

(10) Patent No.: US 11,985,857 B2
(45) Date of Patent: May 14, 2024

(54) DISPLAY DEVICE, METHOD OF MANUFACTURING DISPLAY DEVICE, AND ELECTRONIC APPARATUS

(71) Applicant: Sony Group Corporation, Tokyo (JP)

(72) Inventor: Hitoshi Tsuno, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/196,744

(22) Filed: May 12, 2023

(65) Prior Publication Data

US 2023/0354644 A1 Nov. 2, 2023

Related U.S. Application Data

(63) Continuation of application No. 17/669,060, filed on Feb. 10, 2022, now Pat. No. 11,678,519, which is a
(Continued)

(30) Foreign Application Priority Data

Jul. 23, 2014 (JP) .................................. 2014-149433

(51) Int. Cl.
*H01L 21/00* (2006.01)
*H01L 21/28* (2006.01)
(Continued)

(52) U.S. Cl.
CPC ......... *H10K 59/1213* (2023.02); *H01L 21/28* (2013.01); *H01L 22/20* (2013.01); *H01L 27/1251* (2013.01); *H01L 29/41* (2013.01); *H01L 29/786* (2013.01); *H01L 29/78645* (2013.01); *H01L 29/78648* (2013.01); *H01L 29/788* (2013.01); *H10K 59/131* (2023.02);
(Continued)

(58) Field of Classification Search
CPC ...... H10K 59/1213; H01L 21/28; H01L 22/20
See application file for complete search history.

(56) References Cited

U.S. PATENT DOCUMENTS

| 6,919,746 B2 * | 7/2005 | Suzuki | ................... H03L 7/095 363/59 |
| 7,851,279 B2 * | 12/2010 | Takano | ............... H01L 27/1251 257/326 |

(Continued)

FOREIGN PATENT DOCUMENTS

| CN | 101022121 A | 8/2007 |
| CN | 101123259 A | 2/2008 |

(Continued)

*Primary Examiner* — Laura M Menz
(74) *Attorney, Agent, or Firm* — Michael Best & Friedrich LLP

(57) ABSTRACT

A display device according to the present disclosure includes: a thin film transistor with a bottom gate structure and a thin film transistor with a top gate structure on a same substrate. A gate electrode of the thin film transistor with the top gate structure is provided in a same layer as a wire layer. A method of manufacturing a display device according to the present disclosure, the display device including a thin film transistor with a bottom gate structure and a thin film transistor with a top gate structure on a same substrate, includes: forming a gate electrode of the thin film transistor with the top gate structure in a same layer as a wire layer.

12 Claims, 21 Drawing Sheets

Related U.S. Application Data continuation of application No. 17/079,939, filed on Oct. 26, 2020, now Pat. No. 11,271,060, which is a continuation of application No. 16/714,254, filed on Dec. 13, 2019, now Pat. No. 10,840,319, which is a continuation of application No. 16/380,522, filed on Apr. 10, 2019, now Pat. No. 10,535,723, which is a continuation of application No. 16/226,130, filed on Dec. 19, 2018, now Pat. No. 10,573,700, which is a continuation of application No. 15/323,651, filed as application No. PCT/JP2015/061962 on Apr. 20, 2015, now Pat. No. 10,297,653.

(51) Int. Cl.
| | |
|---|---|
| *H01L 21/66* | (2006.01) |
| *H01L 27/12* | (2006.01) |
| *H01L 29/41* | (2006.01) |
| *H01L 29/786* | (2006.01) |
| *H01L 29/788* | (2006.01) |
| *H10K 59/121* | (2023.01) |
| *H10K 59/131* | (2023.01) |
| *H01L 21/265* | (2006.01) |
| *H01L 21/285* | (2006.01) |
| *H10K 59/12* | (2023.01) |

(52) U.S. Cl.
CPC .. *H01L 21/26513* (2013.01); *H01L 21/28556* (2013.01); *H01L 27/124* (2013.01); *H01L 27/1274* (2013.01); *H10K 59/1201* (2023.02)

(56) References Cited

U.S. PATENT DOCUMENTS

| | | | | |
|---|---|---|---|---|
| 8,284,183 | B2* | 10/2012 | Yamamoto | G09G 3/3233 326/112 |
| 8,947,327 | B2* | 2/2015 | Yamashita | G09G 3/3233 345/82 |
| 8,988,415 | B2* | 3/2015 | Yamamoto | H10K 59/131 345/206 |
| 9,412,763 | B2* | 8/2016 | Morosawa | G02F 1/1339 |
| 9,721,977 | B2* | 8/2017 | Morosawa | H01L 29/78696 |
| 10,290,742 | B2* | 5/2019 | Yamazaki | H01L 27/1255 |
| 10,297,653 | B2* | 5/2019 | Tsuno | H01L 29/78648 |
| 10,396,212 | B2* | 8/2019 | Lee | H10K 50/805 |
| 10,535,723 | B2* | 1/2020 | Tsuno | H01L 29/78648 |
| 10,573,700 | B2* | 2/2020 | Tsuno | H10K 59/131 |
| 10,840,319 | B2* | 11/2020 | Tsuno | H01L 22/20 |
| 11,271,060 | B2* | 3/2022 | Tsuno | H01L 29/78648 |
| 11,678,519 | B2* | 6/2023 | Tsuno | H10K 59/131 257/72 |
| 11,696,053 | B2* | 7/2023 | Niwa | H01L 27/14612 348/280 |
| 11,776,475 | B2* | 10/2023 | Minami | G09G 3/3233 345/690 |
| 2008/0073654 | A1* | 3/2008 | Miyake | H01L 27/1251 257/E21.414 |
| 2008/0217620 | A1* | 9/2008 | Park | H01L 27/1277 257/E33.001 |
| 2009/0001452 | A1 | 1/2009 | Takano | |
| 2009/0002590 | A1* | 1/2009 | Kimura | H01L 27/1214 438/151 |
| 2009/0072908 | A1* | 3/2009 | Daio | H03G 3/3084 330/278 |
| 2009/0167652 | A1* | 7/2009 | Yamamoto | G09G 3/3233 345/84 |
| 2011/0012104 | A1* | 1/2011 | Kang | H01L 27/1251 438/34 |
| 2012/0249904 | A1* | 10/2012 | Morosawa | H01L 29/78696 257/E33.012 |
| 2014/0247204 | A1* | 9/2014 | Uchino | H05B 45/60 345/92 |
| 2016/0315107 | A1* | 10/2016 | Morosawa | H01L 29/78618 |
| 2017/0162641 | A1* | 6/2017 | Tsuno | H01L 29/78648 |
| 2018/0006102 | A1* | 1/2018 | Oh | G09G 3/3233 |
| 2018/0269269 | A1* | 9/2018 | Kim | G06F 3/0446 |
| 2018/0284551 | A1* | 10/2018 | Shim | G02F 1/136286 |
| 2019/0013411 | A1* | 1/2019 | Lee | H01L 29/66757 |
| 2019/0148471 | A1* | 5/2019 | Tsuno | H01L 29/786 257/72 |
| 2019/0237530 | A1* | 8/2019 | Tsuno | H01L 27/1251 |
| 2020/0227495 | A1* | 7/2020 | Tsuno | H10K 59/1213 |
| 2021/0210574 | A1* | 7/2021 | Tsuno | H01L 21/28 |
| 2021/0320140 | A1* | 10/2021 | Kitano | H01L 27/14612 |
| 2022/0285471 | A1* | 9/2022 | Tsuno | H01L 22/20 |
| 2022/0399462 | A1* | 12/2022 | Jang | H01L 29/6675 |
| 2023/0009509 | A1* | 1/2023 | Minami | G09F 9/30 |
| 2023/0013673 | A1* | 1/2023 | Niwa | H04N 25/70 |
| 2023/0354644 | A1* | 11/2023 | Tsuno | H01L 29/41 |

FOREIGN PATENT DOCUMENTS

| | | | | |
|---|---|---|---|---|
| CN | 101383125 A | | 3/2009 | |
| CN | 101783361 A | | 7/2010 | |
| CN | 10-1958339 A | | 1/2011 | |
| CN | 106663394 A | * | 5/2017 | ............ H01L 21/28 |
| CN | 107564919 A | * | 1/2018 | ........... G09G 3/3233 |
| CN | 110246850 A | * | 9/2019 | ............ H01L 21/28 |
| CN | 106663394 B | * | 10/2019 | ............ H01L 21/28 |
| CN | 110600486 A | * | 12/2019 | ............ H01L 21/28 |
| CN | 110246850 B | * | 12/2022 | ............ H01L 21/28 |
| CN | 110600486 B | * | 4/2023 | ............ H01L 21/28 |
| JP | 09-045931 A | | 2/1997 | |
| JP | 09-090403 A | | 4/1997 | |
| JP | 2003-223120 A | | 8/2003 | |
| JP | 2003-273123 A | | 9/2003 | |
| JP | 2007-219517 A | | 8/2007 | |
| JP | 2010-003668 A | | 1/2010 | |
| JP | 2011-023695 A | | 2/2011 | |
| JP | 2012-019117 A | | 1/2012 | |
| JP | 2012-023346 A | | 2/2012 | |
| JP | 2012-146956 A | | 8/2012 | |
| JP | 5508301 B2 | * | 5/2014 | ........... G09G 3/3233 |
| JP | 2015156486 A | * | 8/2015 | ......... H01L 27/1225 |
| JP | 2021157195 A | | 10/2021 | |
| JP | 2021157195 A | * | 10/2021 | ....... G02F 1/133514 |
| KR | 20110006812 A | | 1/2011 | |
| KR | 20130012450 A | | 2/2013 | |
| WO | 2011048838 A1 | | 4/2011 | |
| WO | 2016013264 A1 | | 1/2016 | |
| WO | WO-2016013264 A1 | * | 1/2016 | ............ H01L 21/28 |
| WO | WO-2021161699 A1 | * | 8/2021 | ........... H01L 31/032 |
| WO | 2022235273 A1 | | 11/2022 | |
| WO | WO-2022235273 A1 | * | 11/2022 | |

\* cited by examiner

DISPLAY DEVICE, METHOD OF MANUFACTURING DISPLAY DEVICE, AND ELECTRONIC APPARATUS

CROSS REFERENCE TO RELATED APPLICATIONS

This application is a Continuation of application Ser. No. 17/669,060, filed Feb. 10, 2022, which is a Continuation of application Ser. No. 17/079,939, filed Oct. 26, 2020, now U.S. Pat. No. 11,271,060 issued on Mar. 8, 2022, which is a Continuation of application Ser. No. 16/714,254, filed Dec. 13, 2019, now U.S. Pat. No. 10,840,319 issued on Nov. 17, 2020, which is a Continuation of application Ser. No. 16/380,522, filed Apr. 10,2019, now U.S. Pat. No. 10,535,723 issued on Jan. 14, 2020, which is a Continuation of application Ser. No. 16/226,130, filed Dec. 19, 2018, now U.S. Pat. No. 10,573,700 issued on Feb. 25, 2020, which is a Continuation of application Ser. No. 15/323,651, filed Jan. 3, 2017, now U.S. Pat. No. 10,297,653 issued on May 21, 2019, which is a U.S. National Phase of International Patent Application No. PCT/JP2015/061962 filed on Apr. 20, 2015, which claims priority benefit of Japanese Patent Application No. JP 2014-149433 filed in the Japan Patent Office on Jul. 23, 2014. Each of the above-referenced applications is hereby incorporated herein by reference in its entirety.

TECHNICAL FIELD

The present disclosure relates to a display device, a method of manufacturing display device, and an electronic apparatus, and particularly, to a plane type (flat panel type) display device, a method of manufacturing the display device, and an electronic apparatus including the display device.

BACKGROUND ART

Liquid crystal display (LCD) devices or organic electro luminescence (EL) display devices are known as plane type display devices (flat displays). In addition, As one of the driving methods of the plane type display devices, there is an active-matrix method. In active-matrix display devices, thin film transistors (TFT) are generally used as active elements driving light emission units (light emission elements) of pixels.

As basic performances necessary in thin film transistors (which will be also described hereinafter as "TFTs" in some cases), a large driving current at the time of writing of a signal, a small leakage current at the time of retaining of a signal, and a small variation in characteristics between elements can be exemplified. On the other hand, performance values necessary in pixel control TFTs and peripheral circuit control TFTs are not necessarily the same, but there are appropriate values. Therefore, it is necessary to separately generate element characteristics between the pixel control TFTs and the peripheral circuit control TFTs. This point is also similar between TFTs when a pixel circuit is configured using the plurality of TFTs in pixels.

In the related art, element characteristics of TFTs are separately generated by changing densities of ion implantation of the TFTs between a display region in which pixels are formed and a peripheral region in which peripheral circuits are formed (for example, see Patent Literature 1).

CITATION LIST

Patent Literature

Patent Literature 1: JP H9-45931A

DISCLOSURE OF INVENTION

Technical Problem

However, in technologies of the related art, in order to change densities of ion implantation, it is necessary to add processes. Accordingly, since costs increase accompanying the processes being added, there is a disadvantage in cost competitiveness.

According to the present disclosure, an object of the present disclosure is to provide a display device in which element characteristics are able to be separately generated without adding processes, a method of manufacturing the display device, and an electronic apparatus including the display device.

Solution to Problem

In order to achieve the object, a display device according to the present disclosure includes: a thin film transistor with a bottom gate structure and a thin film transistor with a top gate structure on a same substrate. A gate electrode of the thin film transistor with the top gate structure is provided in a same layer as a wire layer.

In order to achieve the object, a method of manufacturing a display device according to the present disclosure, the display device including a thin film transistor with a bottom gate structure and a thin film transistor with a top gate structure on a same substrate, includes: forming a top gate electrode of the thin film transistor with the top gate structure in a same layer as a wire layer.

In order to achieve the object, an electronic apparatus according to the present disclosure includes: a display device which includes a thin film transistor with a bottom gate structure and a thin film transistor with a top gate structure on a same substrate and in which a top gate electrode of the thin film transistor with the top gate structure is provided in a same layer as a wire layer.

Advantageous Effects of Invention

According to the present disclosure, element characteristics are able to be separately generated in a structure without adding processes since the same layer as a wire layer is used as a gate electrode of a thin film transistor with a top gate structure.

Note that the present disclosure is not limited to exhibiting the effect described herein at all and may exhibit any effect described in the present specification. In addition, the effects described in the present specification are not limiting but are merely examples, and there may be additional effects.

MODE(S) FOR CARRYING OUT THE INVENTION

Figure 1:
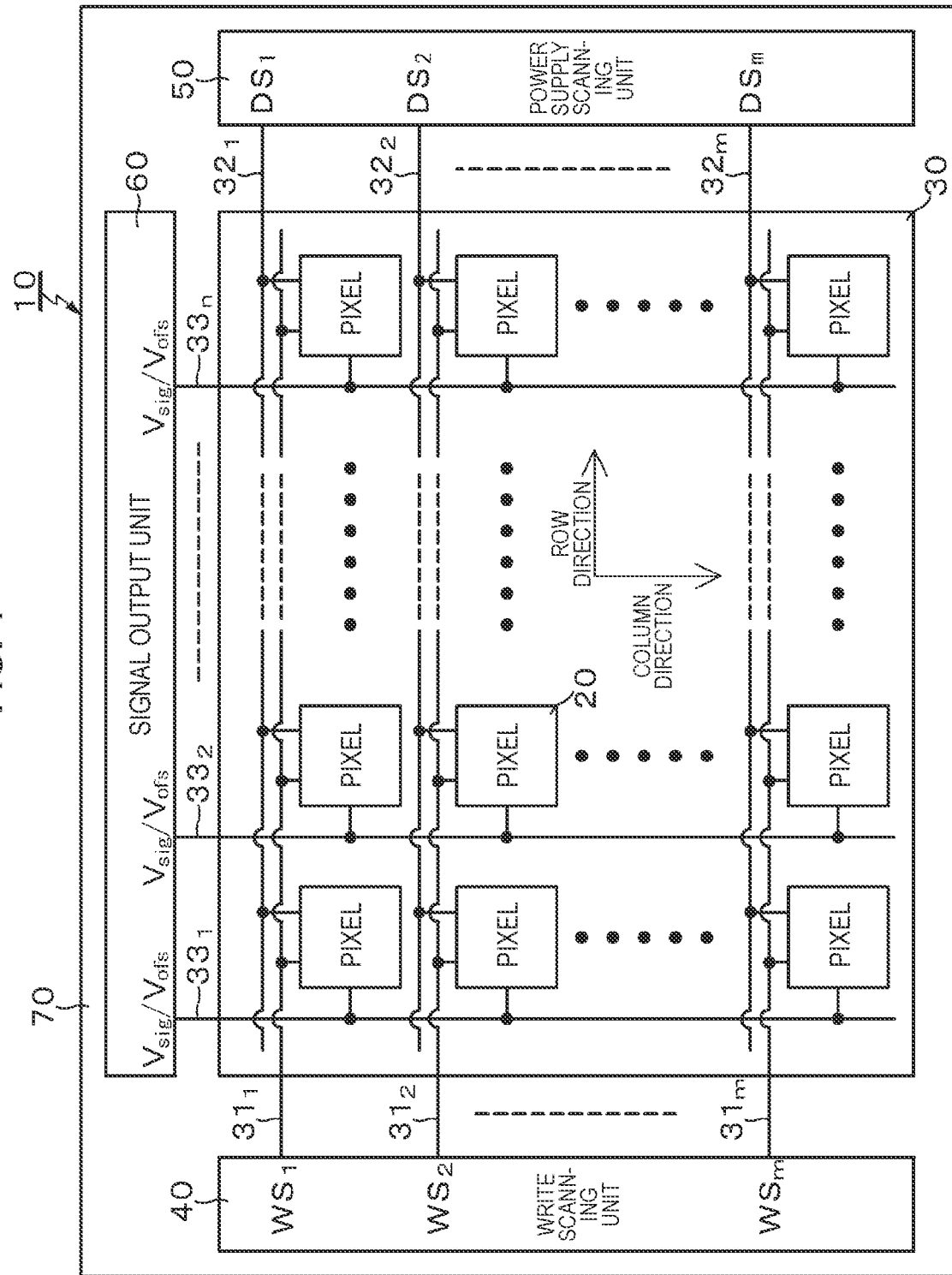
FIG. 1 is a system configuration diagram showing a schematic basic configuration of an active-matrix display device to which the technology of the present disclosure is applied.

Hereinafter, preferred embodiments for implementing the technology of the present disclosure (which will be described hereinafter as "embodiments") will be described in detail with reference to the appended drawings. The technology of the present disclosure is not limited to the embodiments, and the various numeric values and materials shown in the embodiments are examples. In description provided below, structural elements that have substantially the same function and structure are denoted with the same reference numerals, and repeated explanation of these structural elements is omitted. Note that description will be provided in the following order.

1. Overall description of display device, method of manufacturing display device, and electronic apparatus according to present disclosure
2. Display device (which is example of organic EL display device) to which technology of present disclosure is applied
   2-1. System configuration
   2-2. Pixel circuit
   2-3. Performance value (element characteristics) necessary in TFT
3. First Embodiment
   3-1. Example 1 [example in which wire layer has one-layer structure]
   3-2. Example 2 [modification example of Example 1: series connection]
   3-3. Example 3 [another modification example of Example 1: parallel connection]
   3-4. Example 4 [example in which wire layer has two-layer structure]
   3-5. Example 5 [modification example of Example 4: series connection]
   3-6. Example 6 [another modification example of Example 4: parallel connection]
4. Second Embodiment
   4-1. Example 7 [example in which wiring CVD method is used: wire layer has one-layer structure]
   4-2. Example 8 [example in which redundant TFT is used]
   4-3. Example 9 [modification example of Example 7: wire layer has two-layer structure]
   4-4. Example 10 [another modification example of Example 7: parallel connection]
5. Third Embodiment
   5-1. Example 11 [example in which TFT with top gate structure in which TFT has no dummy gate electrode]
6. Electronic apparatus (example of smartphone)

<Overall Description of Display Device, Method of Manufacturing Display Device, and Electronic Apparatus According to Present Disclosure>

In a display device, a method of manufacturing the display device, and an electronic apparatus according to the present disclosure, a top gate electrode of a thin film transistor with a top gate structure can be configured to be integrated by extending from a wire electrically connected to a source/drain region of a thin film transistor with a bottom gate structure. In addition, the thin film transistor with the top gate structure can be configured to include a dummy gate electrode in a floating state without supplying a potential.

In the display device having the above-described preferred configuration, the method of manufacturing the display device, and the electronic apparatus according to the present disclosure, a wire layer in which a top gate structure is provided can be configured to be a first wire layer provided on an inter-layer insulation film on a thin film transistor. Alternatively, in a TFT structure in which the first wire layer is provided on the inter-layer insulation film on the thin film transistor and a first inter-layer film is provided on the first wire layer, a wire layer in which the top gate structure is provided can be configured to be a second wire layer provided on the first inter-layer film.

In addition, in the display device having the above-described preferred configuration, the method of manufacturing the display device, and the electronic apparatus according to the present disclosure, in a TFT structure in which a contact hole is formed in a site of the inter-layer insulation film corresponding to a channel region of the thin film transistor with the top gate structure, a gate insulation film is provided on the inter-layer insulation film containing the contact hole. The gate insulation film can be constituted by a high dielectric inter-layer film.

Alternatively, in the display device having the above-described preferred configuration, the method of manufacturing the display device, and the electronic apparatus according to the present disclosure, in a TFT structure in which the contact hole is formed in a site of the first inter-layer film corresponding to the thin film transistor with the top gate structure, the top gate electrode of the thin film transistor with the top gate structure can be provided in the same layer as a second wire layer on the first inter-layer film, in the contact hole, and on the gate insulation film.

In addition, in the display device having the above-described preferred configuration, the method of manufacturing the display device, and the electronic apparatus according to the present disclosure, the thin film transistor with the bottom gate structure and the thin film transistor with the top gate structure are connected in series for use. Alternatively, these thin film transistors are connected in parallel for use. At this time, preferably, a source or drain region of the thin film transistor with the bottom gate structure is connected directly to a source or drain region of the thin film transistor with the top gate structure without passing through a wire layer. In addition, preferably, a bottom gate electrode of the thin film transistor with the bottom gate structure and the top gate electrode of the thin film transistor with the top gate structure have a same potential.

Alternatively, in the display device having the above-described preferred configuration, the method of manufacturing the display device, and the electronic apparatus according to the present disclosure, a unit pixel including a light emission unit can be disposed to be constituted. The unit pixel can include a writing transistor that writes a signal and a drive transistor that drives the light emission unit based on the signal written by the writing transistor. The writing transistor can be constituted by the thin film transistor with the bottom gate structure. The drive transistor can be constituted by the thin film transistor with the top gate structure.

Here, the light emission unit of the unit pixel can be constituted by a current-driven electro-optical element, for example, an organic electro luminescence (EL) element. The organic EL element is a self-luminous element that uses a phenomenon in which light is emitted when an electric field is applied to an organic thin film using an electro luminescence of an organic material. As the current-driven electro-optical element, not only an organic EL element but also an inorganic EL element, an LED element, a semiconductor laser element, or the like can be exemplified.

The organic EL element has a configuration in which a hole transport layer, a light emission layer, an electron transport layer, and an electron injection layer are sequentially stacked on a first electrode (for example, an anode) to form an organic layer, and a second electrode (for example, a cathode) is formed on the organic layer. By applying a direct-current voltage between the first and second electrodes, light is emitted when holes pass through the hole transport layer from the first electrode (anode), electrons pass through the electron transport layer from the second electrode (cathode) and are injected into the light emission layer, and the electrons and the holes are recombined in the light emission layer.

An organic EL display device that uses organic EL elements as light emission units of pixels has the following characteristics. Because the organic EL elements can be driven with an applied voltage of 10 V or lower, the organic EL display device consumes low electric power. Since the organic EL elements are self-luminous elements, the organic EL display device has higher visibility of images than a liquid crystal display device, which is another display device of the same plane type, and even can be made lighter and thinner because no lighting member such as a backlight or the like is necessary for the organic EL display device. Furthermore, since a response speed of an organic EL element is about several μsec, which is a very high speed, the organic EL display device does not cause afterimages during display of dynamic images.

In another method of manufacturing the display device according to the present disclosure, an array test is performed to determine element characteristics of an individual thin film transistor in a step of forming a thin film transistor with a bottom gate structure. A top gate electrode is formed in a same layer as a wire layer in regard to the thin film transistor with the bottom gate structure in order to repair a pixel including a thin film transistor determined to be worse than predetermined characteristics. At this time, the top gate electrode is preferably formed using a technical method of connecting a wire by forming a metal thin film in accordance with a CVD method.

In still another method of manufacturing the display device including the above-described preferred configuration according to the present disclosure, when the thin film transistor in which the top gate electrode is formed is a repairing target thin film transistor determined to be worse than predetermined characteristics, the top gate electrodes can be formed to face a bottom gate electrode of the repairing target thin film transistor with a channel region interposed therebetween. Alternatively, when the thin film transistor in which the top gate electrode is formed is another thin film transistor that is provided on a same substrate as a repairing target thin film transistor determined to be worse than predetermined characteristics and connected in parallel to the repairing target thin film transistor, the top gate electrodes can be formed to face a bottom gate electrode of the other thin film transistor with a channel region interposed therebetween.

<Display Device to which the Technology of Present Disclosure is Applied>
[System Configuration]

FIG. 1 is a system configuration diagram showing a schematic basic configuration of an active-matrix display device to which the technology of the present disclosure is applied.

The active-matrix display device is a display device in which driving of a light emission unit (light emission element) is performed by an active element provided in the same pixel as the light emission unit, for example, an insulated gate field-effect transistor. Typically, a thin film transistor (TFT) can be used as the insulated gate field-effect transistor.

Here, a case in which an active-matrix organic EL display device uses an organic EL element as a light emission unit (light emission element) of a unit pixel (pixel circuit) will be described as an example. The organic El element is a current-driven electro-optical element of which light emission luminance changes according to a value of a current flowing through the device. Hereinafter, the "unit pixel/pixel circuit" is described simply as a "pixel" in some cases. The thin film transistor is used not only for control of a pixel but also for control of a peripheral circuit to be described below.

As shown in FIG. 1, an organic EL display device 10 to which the technology of the present disclosure is applied is configured to include a pixel array unit 30 constituted such that a plurality of unit pixels 20 are disposed 2-dimensionally in a matrix form (matrix state) and a driving unit (periphery) disposed in a peripheral region of the pixel array unit 30 and driving pixels 20. The driving unit is constituted by, for example, a write scanning unit 40, a power supply scanning unit 50, and a signal output unit 60 and drives the pixels 20 of the pixel array unit 30. In this example, the write scanning unit 40, the power supply scanning unit 50, and the signal output unit 60 are mounted on the same substrate as the pixel array unit 30, that is, a display panel 70. Here, it is also possible to employ a configuration in which some or all of the write scanning unit 40, the power supply scanning unit 50, and the signal output unit 60 are provided out of the display panel 70.

Here, when the organic EL display device 10 displays in color, one pixel (unit pixel) serving as a unit forming a color image is constituted by a plurality of sub pixels. In this case, each of the sub pixels corresponds to a pixel 20 of FIG. 1. To be more specific, in the display device that displays in color, one pixel is constituted by, for example, three sub pixels including a sub pixel emitting red (R) light, a sub pixel emitting green (G) light, and a sub pixel emitting blue (B) light.

One pixel, however, is not limited to a combination of sub pixels having three primary colors including RGB, and it is also possible to add sub pixels having one or more colors to the sub pixels having the three primary colors to form one pixel. To be more specific, it is possible to form one pixel by adding a sub pixel that emits white (W) light to increase luminance, or to form one pixel by adding at least one sub pixel which emits a complementary color of light to expand a color reproduction range.

In the pixel array unit 30, scanning lines 31 ($31_1$ to $31_m$) and power supply lines 32 ($32_1$ to $32_m$) are wired for each pixel row in the row direction (pixel array direction of pixel rows or horizontal direction) in the array of the pixels 20 in m rows and n columns. Furthermore, signal lines 33 ($33_1$ to $33_n$) are wired for each pixel column in the column direction (pixel array direction of pixel columns or vertical direction) in the array of the pixels 20 in m rows and n columns.

The scanning lines $31_1$ to $31_m$ are connected to respective output terminals of the rows corresponding to the write scanning unit 40. The power supply lines $32_1$ to $32_m$ are connected to respective output terminals of the rows corresponding to the power supply scanning unit 50. The signal lines $33_1$ to $33_n$ are connected to output terminals of the columns corresponding to the signal output unit 60.

The write scanning unit 40 is constituted by a shift register circuit, and the like. At the time of writing a signal voltage of a video signal onto each pixel 20 of the pixel array unit 30, the write scanning unit 40 performs so-called line sequential scanning in which each of the pixels 20 of the pixel array unit 30 is sequentially scanned in units of rows by sequentially supplying write scanning signals WS ($WS_1$ to $WS_m$) to the scanning lines 31 ($31_1$ to $31_m$).

The power supply scanning unit 50 is constituted by a shift register circuit and the like, like the write scanning unit 40. The power supply scanning unit 50 supplies power supply voltages DS ($DS_1$ to $DS_m$) that can switch to a first power supply voltage $V_{ccp}$ and a second power supply voltage $V_{ini}$ that is lower than the first power supply voltage $V_{ccp}$ to the power supply lines 32 ($32_1$ to $32_m$) in synchronization with the line sequential scanning performed by the write scanning unit 40. As will be described later, light emission and non-light-emission (light-off) of the pixels 20 are controlled as a voltage between the power supply voltages DS $V_{ccp}$ and $V_{ini}$ are switched.

The signal output unit 60 selectively outputs a signal voltage of a video signal (which may be described hereinafter simply as a "signal voltage") $V_{sig}$ that is based on luminance information supplied from a signal supply source (not shown) and a reference voltage $V_{ofs}$. Herein, the reference voltage $V_{ofs}$ is a voltage serving as a reference of the signal voltage of the video signal $V_{sig}$ (for example, a voltage equivalent to a black level of the video signal), and is used in a threshold value correction process to be described later.

The signal voltage $V_{sig}$ and the reference voltage $V_{ofs}$ output from the signal output unit 60 are written into each of the pixels 20 of the pixel array unit 30 via the signal lines 33 ($33_1$ to $33_n$) in units of pixel rows selected through scanning performed by the write scanning unit 40. In other words, the signal output unit 60 employs a driving form of line sequential writing in which the signal voltage $V_{sig}$ is written in units of rows (lines).

[Pixel Circuit]

Figure 2:
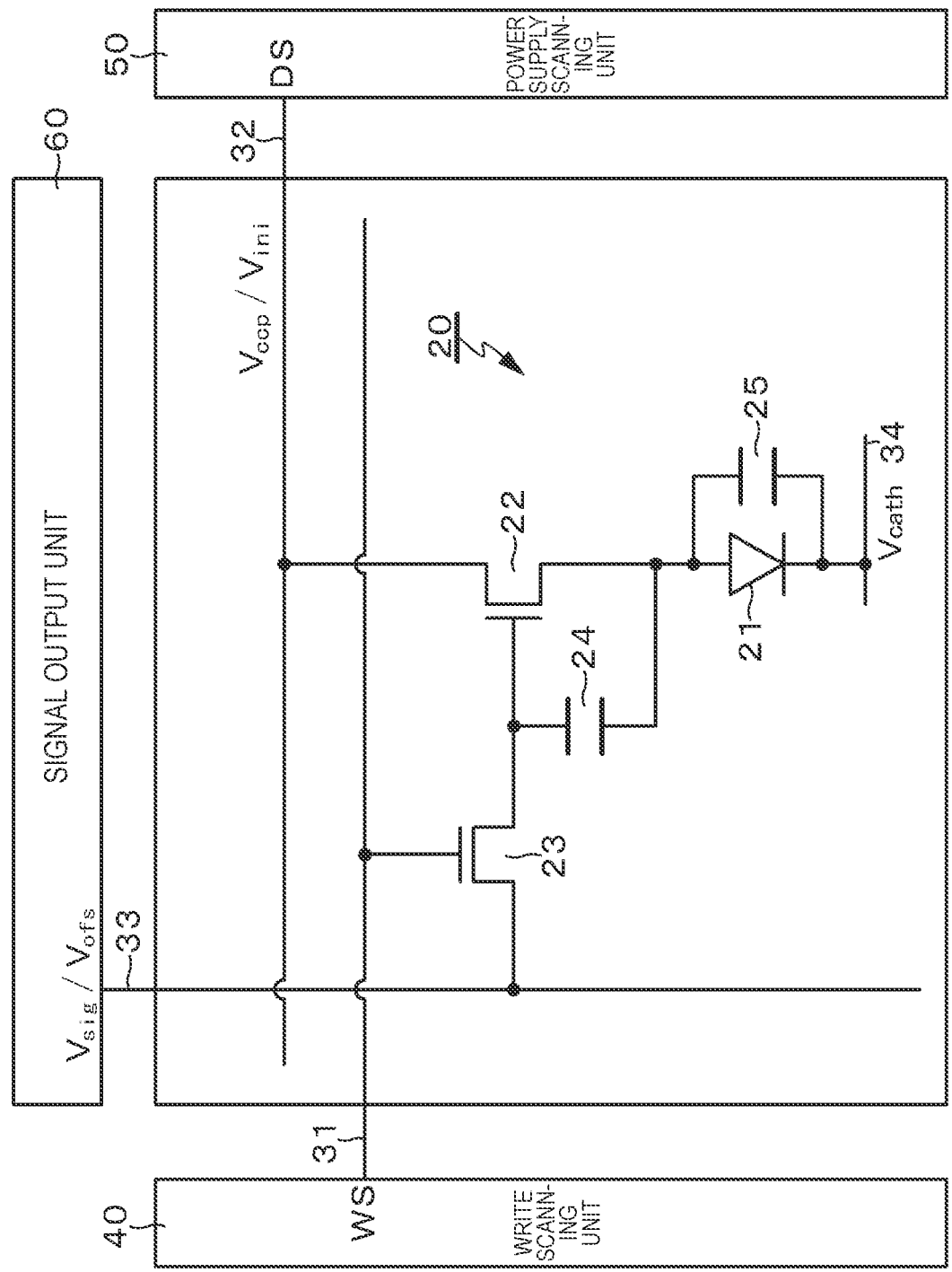
FIG. 2 is a circuit diagram showing an example of a detailed circuit configuration of a unit pixel (pixel circuit).

FIG. 2 is a circuit diagram showing an example of a detailed circuit configuration of a unit pixel (pixel circuit) 20. The light emission unit of the pixel 20 is constituted by an organic EL element 21 that is an example of a current-driven electro-optical element of which light emission luminance changes according to a value of a current flowing through the device.

As shown in FIG. 2, the pixel 20 includes the organic EL element 21 and a drive circuit that drives the organic EL element 21 by applying a current to the organic EL element 21. The cathode electrode of the organic EL element 21 is connected to a common power supply line 34 that is commonly wired for all of the pixels 20.

The drive circuit that drives the organic EL element 21 has a 2Tr2C circuit configuration including a drive transistor 22, a writing transistor 23, a retention capacitor 24, and an auxiliary capacitor 25, that is, two transistors (Tr) and two capacitative elements (C). Here, N-channel type thin film transistors (TFTs) are used as the drive transistor 22 and the writing transistor 23. Here, a conductive combination of the drive transistor 22 and the writing transistor 23 mentioned here is merely an example, but the present disclosure is not limited to this combination.

One electrode (the source or drain electrode) of the drive transistor 22 is connected to the power supply lines 32 ($32_1$ to $32_m$) and the other electrode (the source or drain electrode) thereof is connected to the anode electrode of the organic EL element 21. One electrode (the source or the drain electrode) of the writing transistor 23 is connected to each of the signal lines 33 ($33_1$ to $33_n$) and the other electrode (the source or the drain electrode) thereof is connected to the gate electrode of the drive transistor 22. In addition, the gate electrode of the writing transistor 23 is connected to the scanning lines 31 ($31_1$ to $31_m$).

With regard to the drive transistor 22 and the writing transistor 23, one electrode refers to a metal wire electrically connected to one source or drain region, and the other electrode refers to a metal wire electrically connected to the other source or drain region. In addition, one electrode may be a source electrode or a drain electrode, and the other electrode may be a drain electrode or a source electrode according to the electric potential relation between the one electrode and the other electrode.

One electrode of the retention capacitor 24 is connected to the gate electrode of the drive transistor 22, and the other electrode thereof is connected to the other electrode of the drive transistor 22 and to the anode electrode of the organic EL element 21. One electrode of the auxiliary capacitor 25 is connected to the anode electrode of the organic EL element 21 and the other electrode thereof is connected to the cathode electrode of the organic EL element 21. That is, the auxiliary capacitor 25 is connected in parallel to the organic EL element 21.

In the configuration described above, the writing transistor 23 enters a conductive state in which a state of a high voltage applied to the gate electrode thereof through the scanning line 31 from the write scanning unit 40 becomes an active state in response to the write scanning signal WS. Accordingly, the writing transistor 23 performs sampling on the signal voltage of the video signal $V_{sig}$ or the reference voltage $V_{ofs}$ according to luminance information supplied from the signal output unit 60 through the signal line 33 at different time points and writes the voltages into the pixel 20. The signal voltage $V_{sig}$ or the reference voltage $V_{ofs}$ written by the writing transistor 23 are retained by the retention capacitor 24.

When the power supply voltage DS of the power supply lines 32 ($32_1$ to $32_m$) becomes the first power supply voltage $V_{ccp}$, the drive transistor 22 operates in a saturation region as one electrode thereof serves as the drain electrode and the other electrode serves as the source electrode. Accordingly, the drive transistor 22 receives supply of a current from the power supply line 32 and then drives the organic EL element 21 to emit light through current driving. To be more specific, the drive transistor 22 supplies the driving current of a current value according to the voltage value of the signal voltage $V_{sig}$ retained in the retention capacitor 24 to the organic EL element 21 to drive the organic EL element 21 to emit light using the current.

When the power supply voltage DS is switched from the first power supply voltage $V_{ccp}$ to the second power supply voltage $V_{ini}$, the drive transistor 22 further operates as a switching transistor as one electrode thereof serves as the source electrode and the other electrode thereof serves as the drain electrode. Accordingly, the drive transistor 22 stops the supply of the driving current to the organic EL element 21 thereby setting the organic EL element 21 to be in a non-light-emission state. In other words, the drive transistor 22 also has the function as a transistor which controls light emission and non-light-emission of the organic EL element 21.

Through the switching operation of the drive transistor 22, it is possible to set a period in which the organic EL element 21 is in a non-light-emission state (non-light-emission period) and to control a ratio of a light emission period and a non-light-emission period (duty) of the organic EL element 21. With the control of duty, it is possible to reduce after image and blur caused by light emission of the pixel over one display frame period and particularly to make a level of quality of a dynamic image more excellent.

Among the first and second power supply voltages $V_{ccp}$ and $V_{ini}$ which are selectively supplied from the power supply scanning unit 50 through the power supply line 32, the first power supply voltage $V_{ccp}$ is a power supply voltage for supplying a drive current that drives the organic EL element 21 to emit light to the drive transistor 22. In addition, the second power supply voltage $V_{ini}$ is a power supply voltage for applying an inverse bias to the organic EL element 21. The second power supply voltage $V_{ini}$ is set to a voltage lower than the reference voltage $V_{ofs}$, for example, when the threshold voltage of the drive transistor 22 is set to $V_{th}$, the second power supply voltage is set to a voltage lower than $V_{ofs}-V_{th}$, and preferably to a voltage sufficiently lower than $V_{ofs}-V_{th}$.

Each pixel 20 of the pixel array unit 30 has the function of correcting variation of a drive current resulting from variation of characteristics of the drive transistor 22. Here, as the characteristics of the drive transistor 22, for example, the threshold voltage $V_{th}$ of the drive transistor 22, and a mobility u of a semiconductor thin film constituting a channel of the drive transistor 22 (which will be described hereinafter simply as "mobility u of the drive transistor 22") are exemplified.

Correction of a variation of a drive current caused due to the variation of the threshold voltage $V_{th}$ (which will be described hereinafter as "threshold correction" in some cases) is performed by initializing a gate voltage $V_g$ of the drive transistor 22 to the reference voltage $V_{ofs}$. To be specific, an operation of setting an initialization voltage (reference voltage $V_{ofs}$) of the gate voltage $V_g$ of the drive transistor 22 as a reference and changing a source voltage $V_s$ of the drive transistor 22 toward a potential obtained by reducing the threshold voltage $V_{th}$ of the drive transistor 22 from the initialization voltage (reference voltage $V_{ofs}$) is performed. When this operation progresses, a gate-source voltage $V_{gs}$ of the drive transistor 22 soon converges on the threshold voltage $V_{th}$ of the drive transistor 22. A voltage equivalent to the threshold voltage $V_{th}$ is retained in the retention capacitor 24. By retaining the voltage equivalent to the threshold voltage $V_{th}$ in the retention capacitor 24, it is possible to suppress dependency of a drain-source current $I_{ds}$ flowing through the drive transistor 22 on the threshold voltage $V_{th}$ when the drive transistor 22 is driven at the signal voltage $V_{sig}$ of a video signal.

Correction of a variation of a drive current caused due to a variation of the mobility u (which will be described hereinafter as "mobility correction") is performed by flowing a current to the retention capacitor 24 via the drive transistor 22 in a state in which the writing transistor 23 enters a conductive state and the signal voltage $V_{sig}$ of the video signal is written. In other words, the correction is performed by applying negative feedback to the retention capacitor 24 with a feedback amount (correction amount) according to the current $I_{ds}$ flowing through the drive transistor 22. When a video signal is written through the correction of the threshold, the dependency of the drain-source current $I_{ds}$ on the threshold voltage $V_{th}$ disappears and the drain-source current $I_{ds}$ depends on the mobility u of the drive transistor 22. Accordingly, by applying negative feedback to the drain-source voltage $V_{ds}$ of the drive transistor 22 with the feedback amount according to the current $I_{ds}$ flowing through the drive transistor 22, it is possible to suppress the dependency of the drain-source current $I_{ds}$ flowing through the drive transistor 22 on the mobility u.

In the pixel 20 having the foregoing configuration, the auxiliary capacitor 25 is used to assist the capacitance of the organic EL element 21. Accordingly, the auxiliary capacitor 25 is not an essential constituent element. That is, the drive circuit of the organic EL element 21 is not limited to the drive circuit having the 2Tr2c circuit configuration of the foregoing configuration. When the capacitance of the organic EL element 21 can be sufficiently ensured, a circuit configuration of 2Tr1C excluding the auxiliary capacitor 25 can also be employed. Further, it is possible to use a circuit configuration in which a switching transistor is appropriately added as necessary.

[Performance Value (Element Characteristics) Necessary in TFT]

In the organic EL display device 10 described above, the pixel circuit is configured using the plurality of TFTs, that is, the drive transistor 22 and the writing transistor 23. Here, the drive transistor 22 is used to directly drive the organic EL element 21. Accordingly, from the viewpoint of the life span of the organic EL element 21, a current supplied from the drive transistor 22 to the organic EL element 21 is preferably small. In order to suppress the current supplied from the drive transistor 22 to the organic EL element 21, a TFT that has relatively poor (degraded) element characteristics may be used as the drive transistor 22.

On the other hand, the writing transistor 23 is used for a correction process such as the threshold correction or the mobility correction described above. Therefore, the writing transistor 23 has to have a drive capability. To compensate for the driving capability, a TFT that has relatively high element characteristics is preferable as the writing transistor 23. In this way, even in the TFTs (the drive transistor 22 and the writing transistor 23) provided in the same pixel 20, performance values necessary in both of the transistors are not necessarily the same and there are respective appropriate values. Therefore, it is necessary to separately generate element characteristics between the drive transistor 22 and the writing transistor 23.

This point is not limited to a case in which a plurality of TFTs are used in the pixel 20 to form a pixel circuit. To be specific, this point also applies to a case in which some or all of the peripheral circuits such as the write scanning unit 40, the power supply scanning unit 50, and the signal output unit 60 are mounted on the same substrate (the display panel 70) as the pixel array unit 30 constituted such that the pixels 20 are disposed in the matrix form. In this case, the performance values necessary in the pixel control TFT (the TFT constituting the pixel circuit) and the peripheral circuit control TFT (the TFT constituting the peripheral circuit) are not necessarily the same and there are respective appropriate values. Therefore, it is necessary to separately generate element characteristics between the pixel control TFT and the peripheral circuit control TFT.

First Embodiment

An object of a technology of the present disclosure is to separately generate element characteristics of thin film transistors (TFTs) provided on the same substrate without adding a process such as a change in density of ion implantation between the TFTs. In order to achieve the object, a TFT with a bottom gate structure and a TFT with a top gate structure on the same substrate are included in a first embodiment of the present disclosure. A gate electrode of the TFT with the top gate structure, that is, a top gate electrode, is provided in the same layer as a wire layer. In other words, the same layer as the wire layer is used as a gate electrode of the TFT with the top gate structure.

Here, the "same layer" means that not only a case of the exact same layer but also a case of substantially the same layer are included and presence of various variations occurring in design or manufacturing is allowed. In addition, the "same layer" is assumed to include not only a layer that has the same height and is provided on the same insulation film (inter-layer insulation film or an inter-layer film) but also a layer that has a different height and is provided on the same insulation film.

In this way, by using the same layer as the wire layer as the gate electrode (the top gate electrode) of the TFT with the top gate structure, it is possible to separately generate performance values (element characteristics) necessary in the TFTs in terms of the structure without employing a method such as a change in density of ion implantation, that is, without adding a process. Hereinafter, specific examples of a TFT structure in which a gate electrode of a TFT with a top gate structure is disposed in the same layer as the wire layer and a method of manufacturing the TFT structure will be described.

In examples to be described below, as shown in FIG. 2, cases in which polysilicon is applied to a semiconductor layer in a TFT structure of a pixel circuit configured using a plurality of TFTs, that is, the drive transistor 22 and the writing transistor 23, are employed as examples for description. The technology of the present disclosure can also be applied to a TFT structure in which amorphous silicon or microcrystalline silicon, or an oxide semiconductor or an organic semiconductor, or the like is used in a semiconductor layer.

Example 1

[Structure]

Figure 3:
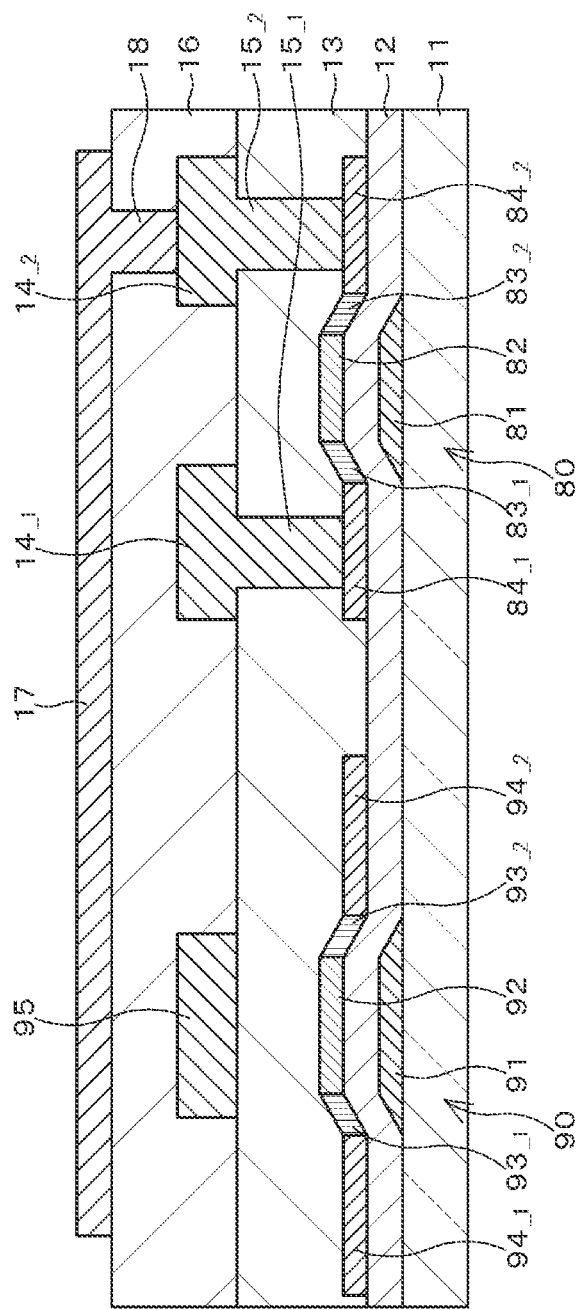
FIG. 3 is a sectional view showing a TFT structure according to Example 1.

FIG. 3 is a sectional view showing a TFT structure according to Example 1. In FIG. 3, a TFT 80 with a bottom gate structure and a TFT 90 with a top gate structure are provided on an insulation transparent substrate, for example, a glass substrate 11. In a correspondence relation with the pixel circuit shown in FIG. 2, the TFT 80 with the bottom gate structure is used as the writing transistor 23 and the TFT 90 with the top gate structure is used as the drive transistor 22. That is, the drive transistor 22 is constituted by the TFT 90 with the top gate structure and the writing transistor 23 is constituted by the TFT 80 with the bottom gate structure.

The TFT 80 with the bottom gate structure includes a bottom gate electrode 81 that is provided on the glass substrate 11, a channel region 82 that is provided to face the bottom gate electrode 81 with a gate insulation film 12 interposed therebetween, and lightly doped drain (LDD) regions $83_{\_1}$ and $83_{\_2}$ and source or drain regions $84_{\_1}$ and $84_{\_2}$ that are provided on both sides of the channel region 82. An inter-layer insulation film 13 is provided on the channel regions 82, the LDD regions $83_{\_1}$ and $83_{\_2}$, and the source or drain regions $84_{\_1}$ and $84_{\_2}$.

Wires $14_{\_1}$ and $14_{\_2}$ are provided on the inter-layer insulation film 13. That is, a wire layer is formed on the inter-layer insulation film 13. The wires $14_{\_1}$ and $14_{\_2}$ are electrically connected to the source or drain regions $84_{\_1}$ and $84_{\_2}$ via contact portions $15_{\_1}$ and $15_{\_2}$ provided to penetrate through the inter-layer insulation film 13. That is, portions of the wires $14_{\_1}$ and $14_{\_2}$ connected to the contact portions $15_{\_1}$ and $15_{\_2}$ serve as source or drain electrodes.

The TFT 90 with the top gate structure includes a dummy gate electrode (bottom gate electrode) 91 that is provided on the glass substrate 11 and does not have a function of an original gate electrode as in the bottom gate electrode 81. The TFT 90 with the top gate structure includes not only the dummy gate electrode 91 but also a channel region 92 that is provided to face the dummy gate electrode 91 via the gate insulation film 12 and LDD regions $93_{\_1}$ and $93_{\_2}$ and source or drain regions $94_{\_1}$ and $94_{\_2}$ that are provided on both sides of the channel region 92.

The TFT 90 with the top gate structure further includes a top gate electrode 95 that is provided on the inter-layer insulation film 13 to face the channel region 92 and has a function of an original gate electrode. That is, the gate electrode of the TFT 90 with the top gate structure, that is, the top gate electrode 95, is provided in the same layer as the wire layer in which the wires $14_{\_1}$ and $14_{\_2}$ including the source or drain electrode of the TFT 80 with the bottom gate structure are formed.

The wires $14_{\_1}$ and $14_{\_2}$ and the top gate electrode 95 are covered with the inter-layer film 16. A pixel electrode 17 is provided on the inter-layer film 16. The pixel electrode 17 is electrically connected to the wire $14_{\_2}$ via a contact portion 18 provided to penetrate through the inter-layer film 16.

Figure 4:
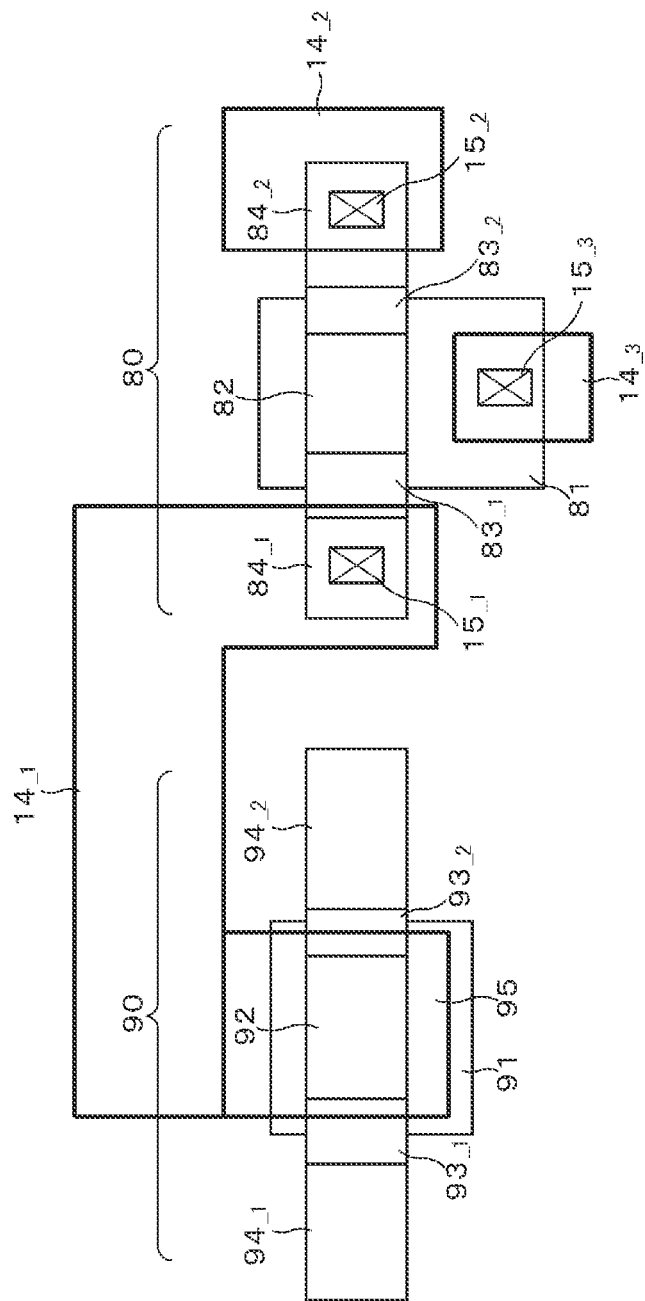
FIG. 4 is a plan view showing the TFT structure according to Example 1.

FIG. 4 is a plan view showing the TFT structure according to Example 1. FIG. 4 shows only the bottom gate electrode 81, the dummy gate electrode 91, the top gate electrode 95, the channel regions 82 and 92, the LDD regions $83_{\_1}$, $83_{\_2}$, $93_{\_1}$, and $93_{\_2}$, the source or drain regions $84_{\_1}$, $84_{\_2}$, $94_{\_1}$, and $94_{\_2}$, the contact portions $15_{\_1}$, $15_{\_2}$, and $15_{\_3}$, and the wires $14_{\_1}$, $14_{\_2}$, and $14_{\_3}$ which are constituent layers of the TFT.

The top gate electrode 95 of the TFT 90 with the top gate structure is integrated by extending from the wire $14_{\_1}$ connected (that is, electrically connected) to one source or drain region $84_{\_1}$ of the TFT 80 with the bottom gate structure via the contact portion $15_{\_1}$. In addition, the bottom gate electrode 81 of the TFT 80 with the bottom gate structure functions as a gate electrode by supplying a potential via the wire 143 and the contact portion $15_{\_3}$. In contrast, the dummy gate electrode 91 of the TFT 90 with the top gate structure is in a floating state without supplying a potential.

[Manufacturing Method]

Next, a method of manufacturing the TFT structure according to Example 1 will be described with reference to process diagrams of FIGS. 5A to 5C.

Figure 5A:
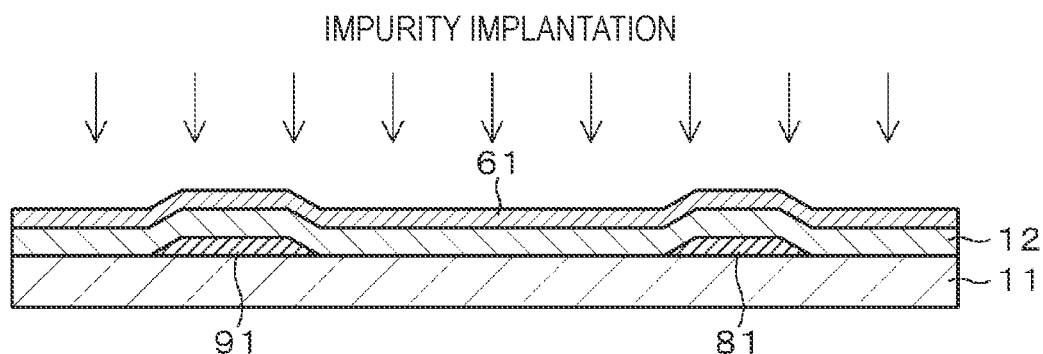
FIGS. 5A to 5C are process diagrams showing a procedure of a method of manufacturing the TFT structure according to Example 1.

(Process of FIG. 5A)

The bottom gate electrode 81 and the dummy gate electrode 91 are formed by forming a metal film of Mo, W, Al, Ti, Cu, or the like or a metal alloy thin film which becomes the bottom gate electrode 81 on the glass substrate 11 so that a thin thickness is about 10 to 500 [nm] according to a method such as a sputtering method and performing a patterning process.

Next, the gate insulation film 12 is formed by forming a silicon oxide film, a silicon nitride film, or a laminated film of a silicon oxide film and a silicon nitride film so that a thin thickness is about 20 to 500 [nm] according to a method such as a chemical vapor deposition (CVD) method. Thereafter, an amorphous silicon layer is formed on the gate insulation film 12 so that a film thickness is about 20 to 200 [nm] according to a method such as a CVD method and the amorphous silicon is crystallized using excimer laser annealing (ELA) or the like. Subsequently, a semiconductor layer which becomes the channel regions 82 and 92, for example, a polysilicon layer 61, is formed by performing appropriate impurity implantation. The polysilicon layer 61 may be directly formed according to CVD without performing the ELA.

Figure 5B:
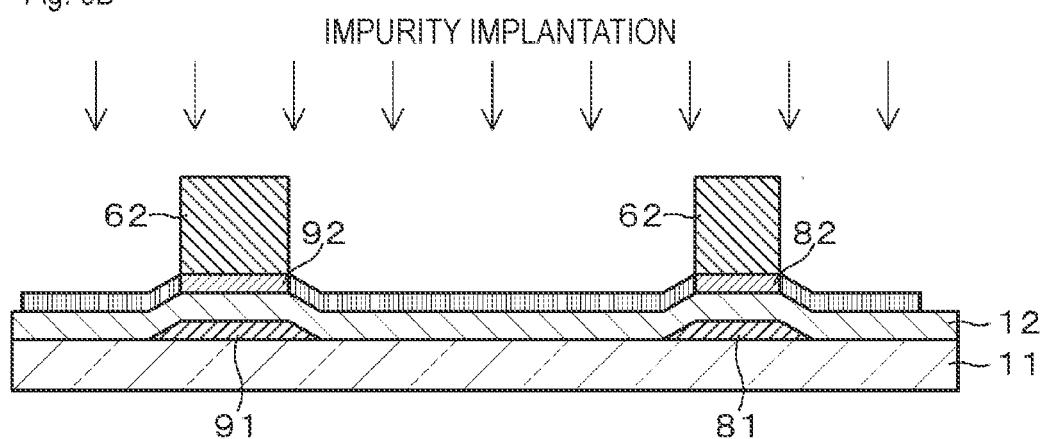

(Process of FIG. 5B)

Next, a photoresist 62 is applied to perform back exposure using the bottom gate electrode 81 and the dummy gate electrode 91 as masks. The photoresist 62 may be applied, for example, after about 10 to 200 [nm] of silicon oxide is stacked on the polysilicon layer 61 (not shown). Thereafter, the channel regions 82 and 92 of the TFTs 80 and 90 are formed by performing necessary impurity implantation using the patterned photoresist 62 as a mask.

Figure 5C:
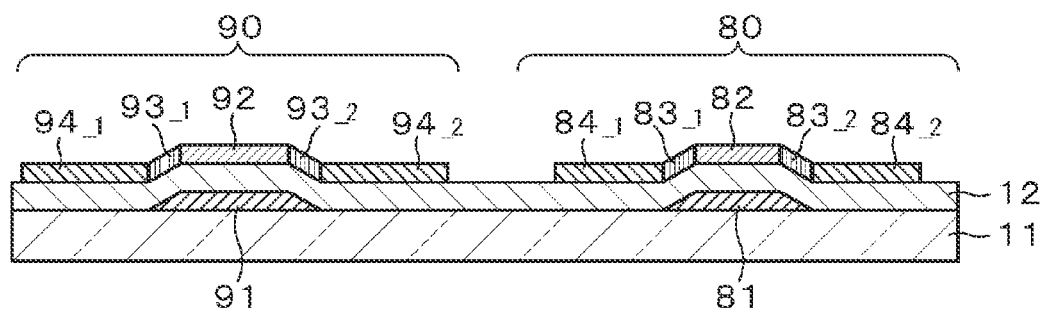

(Process of FIG. 5C)

Next, the LDD regions $83_{\_1}$, $83_{\_2}$, $93_{\_1}$, and $93_{\_2}$ and the source or drain regions $84_{\_1}$, $84_{\_2}$, $94_{\_1}$, and $94_{\_2}$ of the TFTs 80 and 90 are formed by performing an appropriate lithography process and impurity implantation. Thereafter, the TFT 80 with the bottom gate structure and the TFT 90 with the top gate structure are formed by separating the semiconductor layer through an impurity activation process and a process of patterning the polysilicon layer 61.

Subsequent processes will be described with reference to FIG. 3. After the TFT 80 with the bottom gate structure and the TFT 90 with the top gate structure are formed, the inter-layer insulation film 13 is formed by forming a silicon oxide film, a silicon nitride film, or a laminated film of a silicon oxide film and a silicon nitride film so that a film thickness is about 50 to 1500 [nm] according to a method such as a CVD method. Subsequently, the contact portions $15_{\_1}$, $15_{\_2}$, and $15_{\_3}$ including the contact holes that penetrate through the inter-layer insulation film 13 are formed through a patterning process. Then, making contact to the semiconductor layer (the source or drain regions $84_{\_1}$ and $84_{\_2}$) via the contact portions $15_{\_1}$ and $15_{\_2}$ is performed and making contact to the bottom gate electrode 81 via the contact portion $15_{\_3}$ is simultaneously performed (see FIG. 4).

Subsequently, a metal film of Mo, W, Al, Ti, Cu, or the like or an alloy film of the metal film of about 100 to 1500 [nm] is formed on the inter-layer insulation film 13 and the contact portions $15_{\_1}$, $15_{\_2}$, and $15_{\_3}$ according to a method such as a sputtering method. Thereafter, the wires $14_{\_1}$ and $14_{\_2}$ and the top gate electrode 95 are integrated through a patterning process. Next, the inter-layer film 16 is formed on the inter-layer insulation film 13 using silicon oxide, silicon nitride, or a photosensitive resin such as polyimide so that a film thickness is about 200 to 3000 [nm] according to a method such as a CVD method or a spin coating method. A laminated film formed of two or more kinds of films may be used in the inter-layer film 16. Next, the contact portion 18 including a contact hole penetrating through the inter-layer film 16 is formed through a patterning process. Next, a metal film is formed using a sputtering method or the like and the pixel electrode 17 is formed through a patterning process.

As described above, the method of manufacturing the TFT structure according to Example 1 includes a process of forming the bottom gate electrode 81 and the dummy gate electrode 91, a process of forming the polysilicon layer 61 which is the semiconductor layer, and the process of forming the gate insulation film 12 between both of the bottom gate electrode 81 and the dummy gate electrode 91, and the polysilicon layer 61. Further, the method includes the process of forming the wire layer including the wires $14_{\_1}$ and $14_{\_2}$ and the inter-layer insulation film 13 on the polysilicon layer 61 and the process of forming the inter-layer film 16 and the pixel electrode 17 on the wire layer. The top gate electrode 95 is formed in the same layer as the wire layer including the wires $14_{\_1}$ and $14_{\_2}$ above the dummy gate electrode 91 to which no potential is supplied with the channel region 92 interposed therebetween so that the channel region 92 is contained in a plan view.

Advantageous Effect

In the TFT structure according to Example 1, since the bottom gate structure and the top gate structure are used together, the element characteristics are able to be separately generated between the TFTs 80 and 90 provided on the same glass substrate 11. In particular, since the top gate electrode 95 of the TFT 90 is provided in the same layer as the wire layer, the element characteristics are able to be separately generated between the TFTs 80 and 90 without adding a process as in the case in which the method of changing density of ion implantation is used. In addition, since it is not necessary to add a process, there is an advantage in cost competitiveness, that is, a reduction in cost is achieved.

Figure 6:
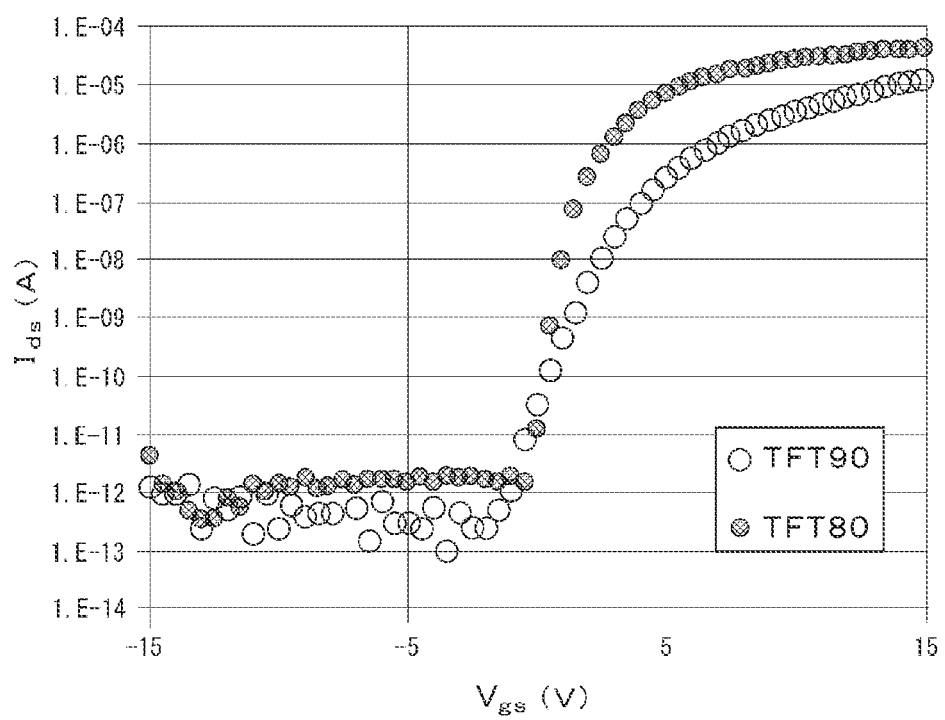
FIG. 6 is a characteristic diagram showing an example of element characteristics of a TFT with a bottom gate structure and a TFT with a top gate structure.

An example of the element characteristics of the TFT 80 with the bottom gate structure and the TFT 90 with the top gate structure is shown in FIG. 6. For example, when $V_{gs}$ is a gate-source voltage, a current difference of about 3.7 multiples of the drive current $I_{ds}$ can be obtained at $V_{gs}$=15 [V]. This ratio can be obtained as an optimum value by appropriately changing processes or design parameters. The element characteristics shown in FIG. 6 are merely an example and various element characteristics can be obtained by optimizing the process.

In addition, the potential of the dummy gate electrode 91 of the TFT 90 with the top gate structure may be floating. Moreover, since the top gate electrode 95 is not limited to being disposed on the bottom gate electrode 81, but may be disposed at any position, there are hardly any restrictions imposed on the layout. Further, since the top gate electrode 95 can be formed using an appropriate inter-layer film as the wire layer including the wires 14$_{\_1}$, 14$_{\_2}$, and 14$_{\_3}$, it is possible to suppress parasitic capacitance applied to the wire layer.

Here, for example, footprints in a case in which TFTs with the bottom gate structure are used as the drive transistor 22 and the writing transistor 23 and in a case in which the TFT with the bottom gate structure and the TFT with the top gate structure are used together as in Example 1 will be examined exemplifying a case in which the circuit of FIG. 2 is applied as the drive circuit of the organic EL element 21.

Figure 7A:
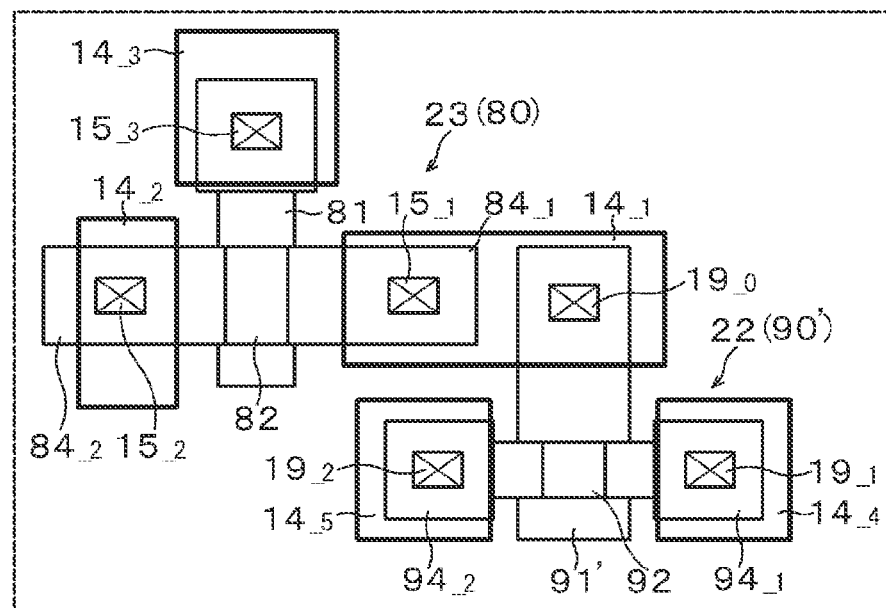
FIG. 7A is a plan view showing disposition when both of a drive transistor and a writing transistor are constituted by TFTs with the bottom gate structure and FIG. 7B is a plan view showing disposition when the drive transistor is constituted by a TFT with the top gate structure and the writing transistor is constituted by a TFT with the bottom gate structure.
Figure 7B:
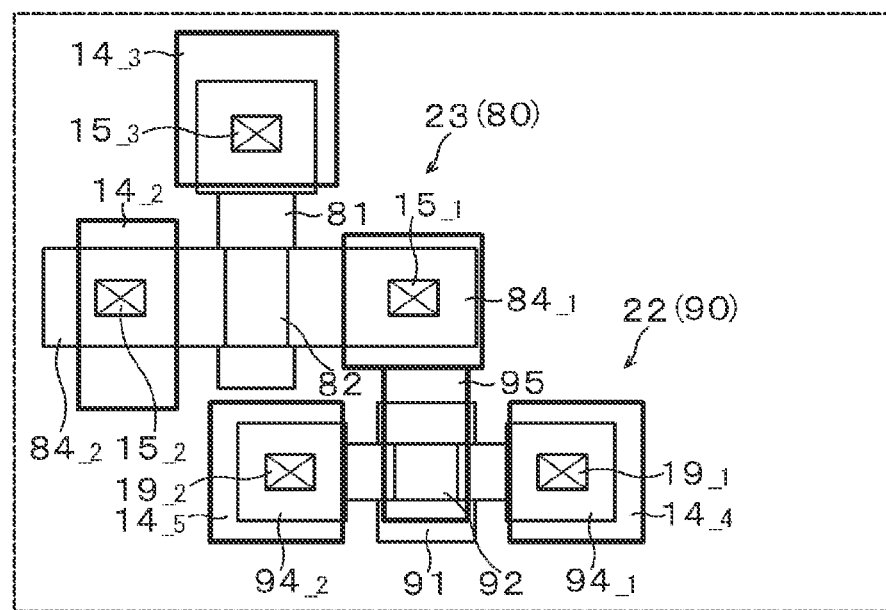

FIG. 7A is a plan view showing disposition when both of the drive transistor 22 and the writing transistor 23 are constituted by TFTs with the bottom gate structure. FIG. 7B is a plan view showing disposition when the drive transistor 22 is constituted by a TFT with the top gate structure and the writing transistor 23 is constituted by a TFT with the bottom gate structure. Here, the light emission element (21) and the capacitative elements (24 and 25) are not shown and only the TFTs (22 and 23) are shown. In the TFTs (22 and 23), the LDD regions are not shown. In addition, FIGS. 7A and 7B show the contact portions 19$_{\_1}$ and 19$_{\_2}$ in contact with the source and drain regions 94$_{\_1}$ and 94$_{\_2}$ of the drive transistor 22 and the wires 14$_{\_4}$ and 14$_{\_5}$ to which the contact portions 19$_{\_1}$ and 19$_{\_2}$ are connected.

In the case of FIG. 7A, a space for contact to a bottom gate electrode 91' (equivalent to the dummy gate electrode 91 in FIG. 3) is essential in order to replace a potential from one source or drain region 841 of the writing transistor 23 (80) to a bottom gate electrode 91' of the drive transistor 22 (90'). That is, since both of the transistors are constituted by the TFTs with the bottom gate structure, as shown in FIG. 7A, the wire 14$_{\_1}$ in contact with one source or drain region 84$_{\_1}$ of the writing transistor 23 (80) in the contact portion 15$_{\_1}$ necessarily comes into contact with the bottom gate electrode 91' of the drive transistor 22 (90') in a contact portion 19$_{\_0}$.

In contrast, in the case of FIG. 7B, that is, in the case of the TFT structure according to Example 1, since the wire 14$_{\_1}$ of which a potential is replaced from one source or drain region 84$_{\_1}$ of the writing transistor 23 (80) extends and is used as the top gate electrode 95 of the drive transistor 22 (90), the footprint can be reduced more than in the case of FIG. 7A. In FIG. 2, the drive transistor 22 constituted by the TFT 90 with the top gate structure is a TFT that controls a current flowing through the organic EL element 21. Here, from the viewpoint of the life span of the organic EL element 21, it is necessary to reduce a drive current of the drive transistor 22. In the TFT structure according to Example 1, as shown in FIG. 6, the current drive capability of the TFT 90 with the top gate structure can be suppressed to be low. Therefore, it is possible to provide the TFT structure appropriate for the drive element of the organic EL element 21.

Example 2

Figure 8A:
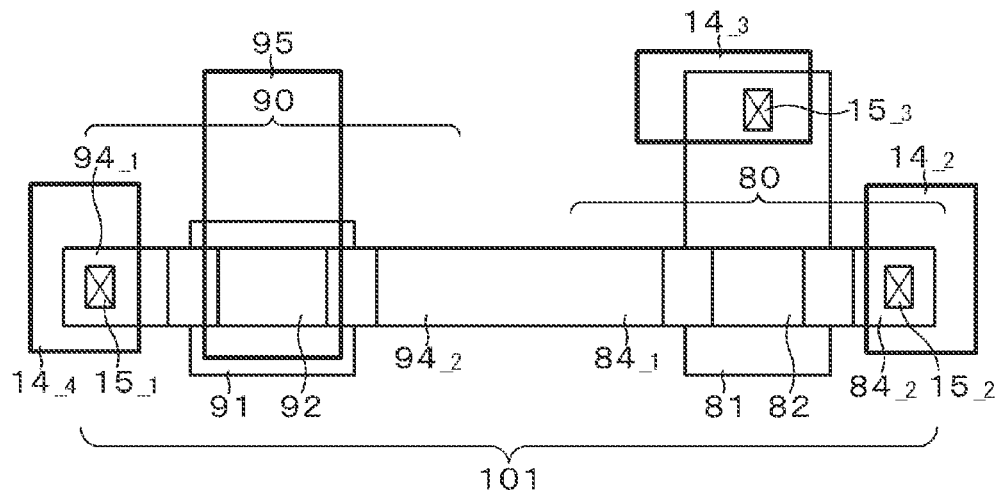
FIG. 8A is a plan view showing a TFT structure according to Example 2 and FIG. 8B is a plan view showing a TFT structure according to Example 3.

Example 2 is a modification example of Example 1. FIG. 8A is a plan view showing a TFT structure according to Example 2. Portions from the bottom gate electrode 81 and the dummy gate electrode 91 to the pixel electrode 17 are formed through the same processes as those of Example 1. The TFT structure according to Example 2 is different from the TFT structure according to Example 1 in that the source or drain region 84$_{\_1}$ of the TFT 80 with the bottom gate structure and the source or drain region 94$_{\_2}$ of the TFT 90 with the top gate structure are directly connected in a plan view without passing through the wire layer including the wires 14$_{\_4}$ and 14$_{\_5}$. That is, the TFTs 80 and 90 are connected in series to function as one TFT 101. The bottom gate electrode 81 of the TFT 80 and the top gate electrode 95 of the TFT 90 may have the same potential.

For example, in a process and element design realizing the element characteristics of FIG. 6, a threshold voltage of current design of the TFT 90 with the top gate structure is higher than a threshold voltage of the TFT 80 with the bottom gate structure. As described above, in the TFT structure according to Example 2, the TFT 101 is constituted such that the TFT 80 with the bottom gate structure and the TFT 90 with the top gate structure are connected in series. Therefore, when the bottom gate electrode 81 and the top gate electrode 95 have the same potential, a threshold voltage of the TFT 101 is identical to a threshold voltage of the TFT 90 with the top gate structure. On the other hand, a current drive capability of the TFT 101 is less than a current drive capability of the TFT 90 with the top gate structure.

Accordingly, in the TFT structure according to Example 2, the element characteristics are able to be separately generated between the TFT 101 having element characteristics different from those of any of the TFT 80 with the bottom gate structure and the TFT 90 with the top gate structure without adding a process as in a case in which a method of changing density of ion implantation is used. The element characteristics in the TFT structure according to Example 2 satisfy the following magnitude relations:

threshold voltages: TFT80<TFT90=TFT101; and current drive capability: TFT80>TFT90>TFT101.

Example 3

Figure 8B:
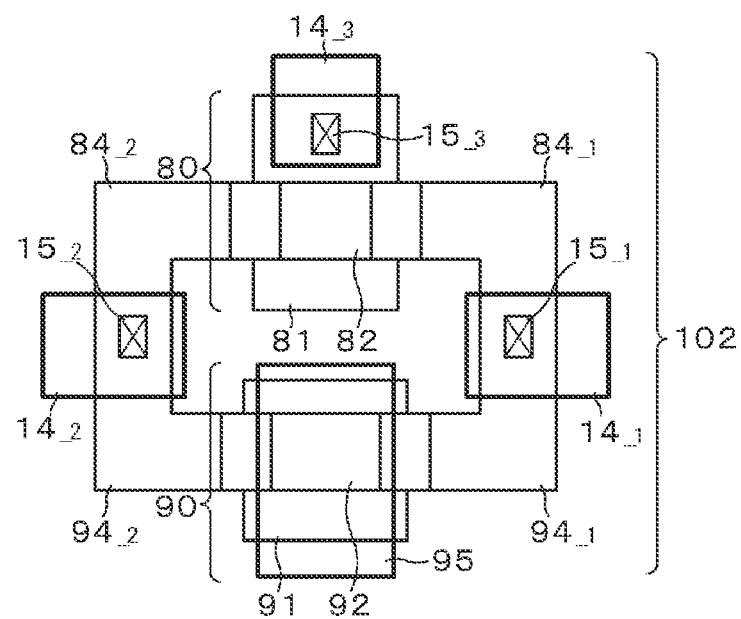

Example 3 is a modification example of Example 1. FIG. 8B is a plan view showing a TFT structure according to Example 3. Portions from the bottom gate electrode 81 and the dummy gate electrode 91 to the pixel electrode 17 are formed through the same processes as those of Example 1. Unlike Example 2, the source or drain regions 84$_{\_1}$ and 84$_{\_2}$ of the TFT 80 with the bottom gate structure and the source or drain region 94$_{\_1}$ and 94$_{\_2}$ of the TFT 90 with the top gate structure are directly connected in a plan view without passing through the wire layer including the wires 14$_{\_4}$ and 14$_{\_5}$. That is, the TFTs 80 and 90 are connected in parallel to functions as one TFT 102. The bottom gate electrode 81 of the TFT 80 and the top gate electrode 95 of the TFT 90 may have the same potential.

As described above, in the TFT structure according to Example 2, the TFT 102 is constituted such that the TFT 80 with the bottom gate structure and the TFT 90 with the top gate structure are connected in parallel. Therefore, when the bottom gate electrode 81 and the top gate electrode 95 have the same potential, a threshold voltage of the TFT 102 is identical to a threshold voltage of the TFT 80 with the bottom gate structure. On the other hand, a current drive capability of the TFT 102 is greater than a current drive capability of the TFT 80 with the bottom gate structure.

Accordingly, in the TFT structure according to Example 3, the element characteristics are able to be separately generated between the TFT 102 having element characteristics different from those of any of the TFT 80 with the bottom gate structure and the TFT 90 with the top gate structure without adding a process as in the case in which the method of changing density of ion implantation is used. The element characteristics in the TFT structure according to Example 3 satisfy the following magnitude relations:

threshold voltages: TFT102=TFT80<TFT90; and current drive capability: TFT102>TFT80>TFT90.

Example 4

[Structure]

Figure 9:
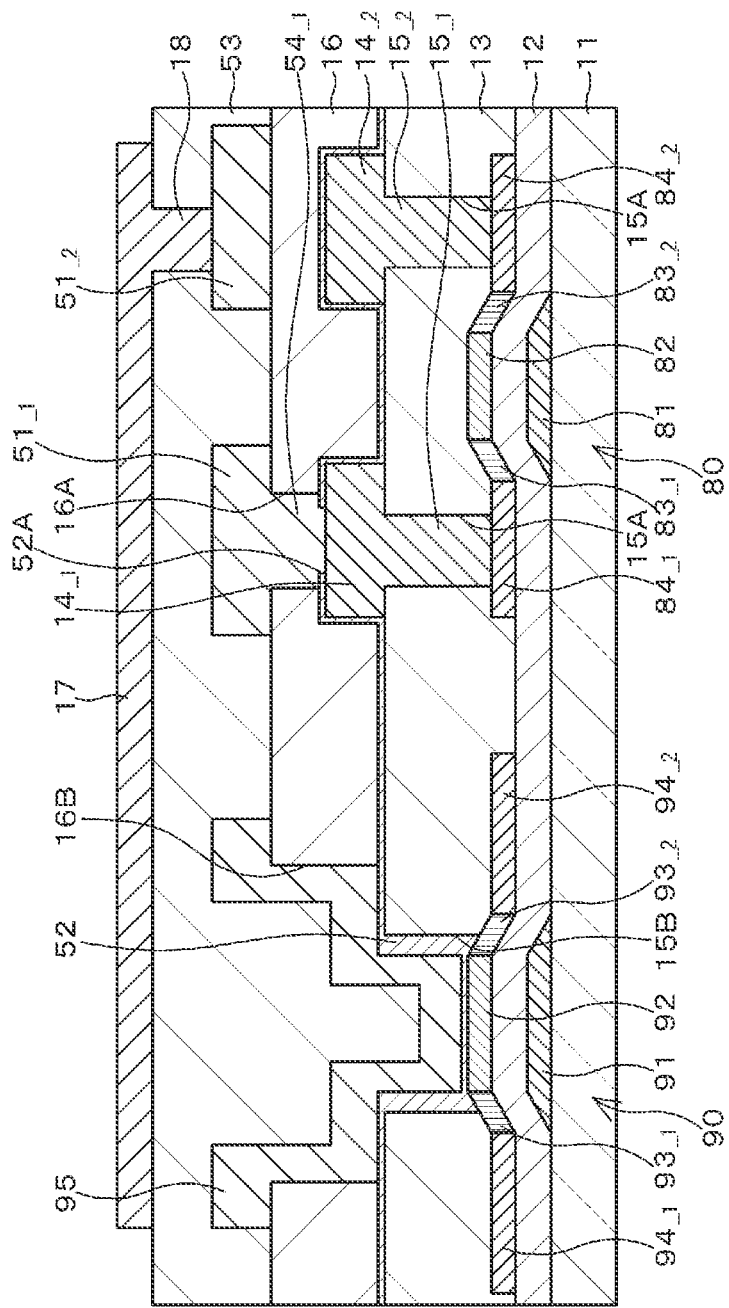
FIG. 9 is a sectional view showing a TFT structure according to Example 4.

FIG. 9 is a sectional view showing a TFT structure according to Example 4. While the wire layer and the inter-layer film have a one-layer structure in Example 1, the wire layer and the inter-layer film have a two-layer structure in Example 4. Further, a TFT structure according to Example 4 is different from the TFT structure according to Example 1 in an element structure of the TFT 90 with the top gate structure. An element structure of the TFT 80 with the bottom gate structure is the same as the TFT structure according to Example 1.

In Example 4, in the correspondence relation with the pixel circuit shown in FIG. 2, the TFT 80 with the bottom gate structure is used as the writing transistor 23 and the TFT 90 with the top gate structure is used as the drive transistor 22 as in Example 1. That is, the drive transistor 22 is constituted by the TFT 90 with the top gate structure and the writing transistor 23 is constituted by the TFT 80 with the bottom gate structure.

As shown in FIG. 9, the wires 14$_{\_1}$ and 14$_{\_2}$ are provided on the inter-layer insulation film 13 as wires of a first layer. The wires 14$_{\_1}$ and 14$_{\_2}$ are in contact with (electrically connected to) the source or drain regions 84$_{\_1}$ and 84$_{\_2}$ through the contact portions 15$_{\_1}$ and 15$_{\_2}$. In addition, a contact hole 15B is formed in a site of the inter-layer insulation film 13 corresponding to the channel region 92 and the LDD regions 93$_{\_1}$ and 93$_{\_2}$ of the TFT 90. A gate insulation film 52 is provided on the inter-layer insulation film 13, on the wires 14$_{\_1}$ and 14$_{\_2}$, and in the contact hole 15B, and the first inter-layer film 16 is provided on the gate insulation film 52.

Wires 51$_{\_1}$ and 51$_{\_2}$ are provided as a second wire layer on the first inter-layer film 16. The wire 51$_{\_1}$ is in contact with, that is, is electrically connected to, the wire 14$_{\_1}$ through the contact portion 54$_{\_1}$ and the contact hole 52A of the gate insulation film 52. A contact hole 16B is formed in a site of the first inter-layer film 16 corresponding to the TFT 90 with the top gate structure. The top gate electrode 95 of the TFT 90 with the top gate structure is provided in the same layer as the second wire layer including the wires 51$_{\_1}$ and 51$_{\_2}$ on the first inter-layer film 16, in the contact hole 16B, and on the gate insulation film 52. The wires 51$_{\_1}$ and 51$_{\_2}$ and the top gate electrode 95 are covered with the second inter-layer film 53.

Figure 10:
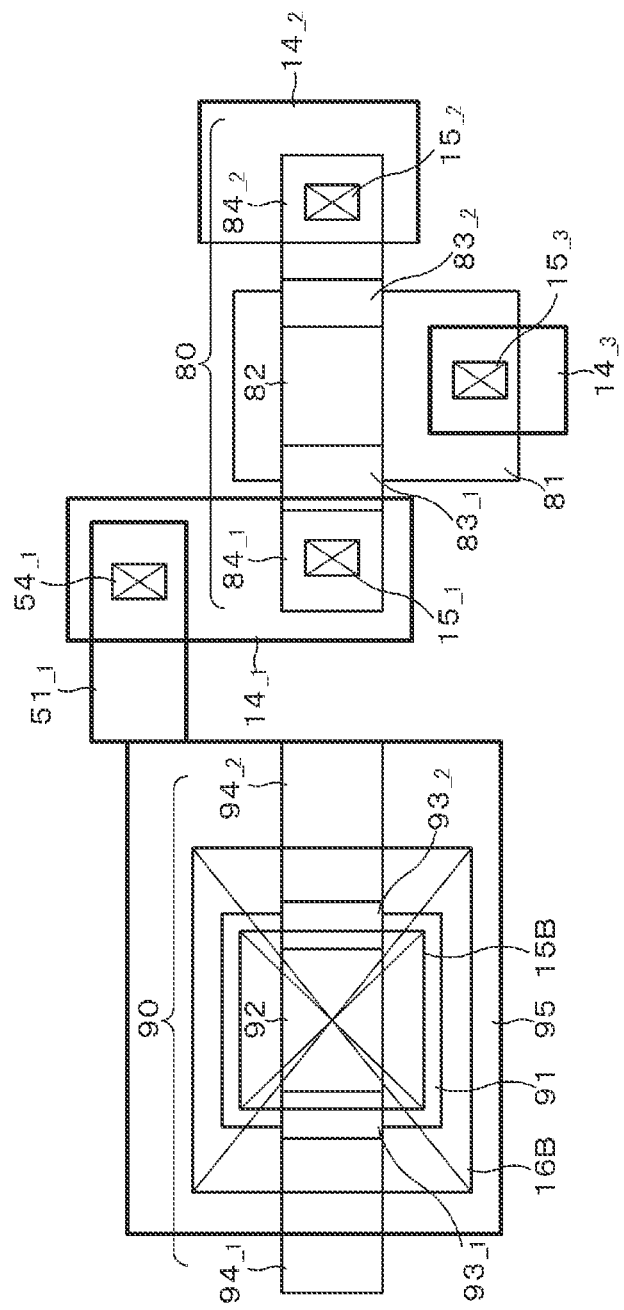
FIG. 10 is a plan view showing the TFT structure according to Example 4.

FIG. 10 is a plan view showing a TFT structure according to Example 4. FIG. 10 shows only the bottom gate electrode 81, the dummy gate electrode 91, the top gate electrode 95, the channel regions 82 and 92, the LDD regions 83$_{\_1}$, 83$_{\_2}$, 93$_{\_1}$, and 93$_{\_2}$, the source or drain regions 84$_{\_1}$, 84$_{\_2}$, 94$_{\_1}$, and 94$_{\_2}$, the contact portions 15$_{\_1}$, 15$_{\_2}$, 15$_{\_3}$, and 54$_{\_1}$, the wires 14$_{\_1}$, 14$_{\_2}$, and 14$_{\_3}$, and the wire 51$_{\_1}$ which are constituent layers of the TFT.

The top gate electrode 95 is integrated by extending the wire 51$_{\_1}$ connected via the contact portion 54$_{\_1}$ and the contact hole 52A of the gate insulation film 52 from the wire 14$_{\_1}$ connected to one source or drain region 84$_{\_1}$ of the TFT 80 with the bottom gate structure via the contact portion 15$_{\_1}$. In addition, the bottom gate electrode 81 functions as a gate electrode by supplying a potential via the wire 14$_{\_3}$ and the contact portion 15$_{\_3}$. The dummy gate electrode 91 is in a floating state without supplying a potential.

[Manufacturing Method]

Next, a method of manufacturing the TFT structure according to Example 4 will be described with reference to process diagrams of FIGS. 11A and 11B.

Figure 11A:
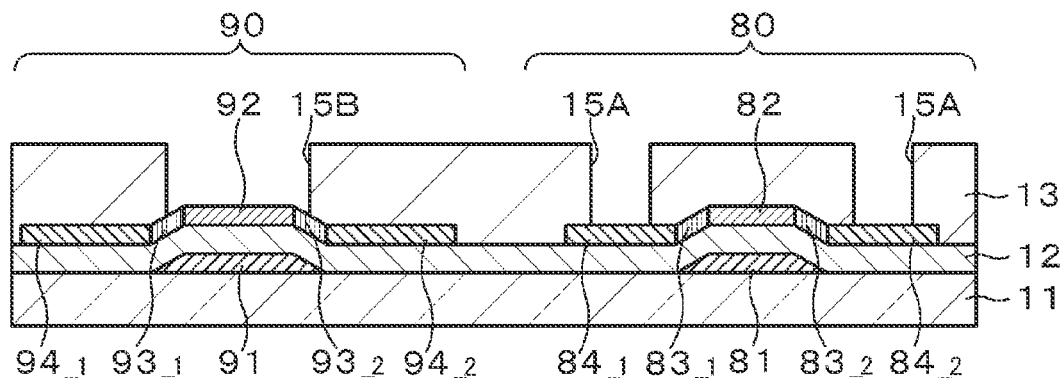
FIGS. 11A and 11B are process diagrams showing a procedure of a method of manufacturing the TFT structure according to Example 4.
Figure 11B:
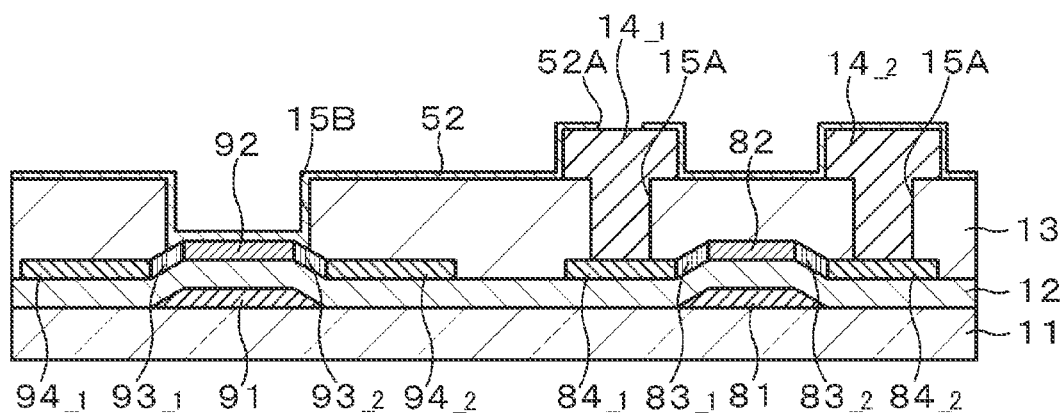

(Process of FIG. 11A)

A process of FIG. 11A corresponds to the process of FIG. 5C. That is, the TFT 80 with the bottom gate structure and the TFT 90 with the top gate structure are formed through the processes of FIGS. 5A to 5C. Thereafter, an inter-layer insulation film 13 is formed by forming a silicon oxide film, a silicon nitride film, or a laminated film of a silicon oxide film and a silicon nitride film according to a method such as a CVD method. Thereafter, a contact hole 15A penetrating through the inter-layer insulation film 13 is formed through a patterning process. However, a contact hole 15B penetrating through the inter-layer insulation film 13 is simultaneously formed so that the channel region 92 of the TFT 90 with the top gate structure is contained unlike Example 1.

(Process of FIG. 1B)

Subsequently, as in Example 1, making contact to the semiconductor layer (the source or drain regions 84$_{\_1}$ and 84$_{\_2}$) via the contact portions 15$_{\_1}$ and 15$_{\_2}$ including the contact hole 15A is performed and contact to the bottom gate electrode 81 in the contact portion 15$_{\_3}$ is also simultaneously performed (see FIG. 10). Next, a first metal film is formed on the inter-layer insulation film 13, in the contact hole 15A, and in the contact hole 15B according to a method such as a sputtering method. Thereafter, a first wire layer including the wires 14$_{\_1}$ and 14$_{\_2}$ is formed by patterning the first metal film in the contact hole 15B so that the first metal film is removed.

Thereafter, the gate insulation film 52 constituted by a high dielectric inter-layer film using silicon oxide, silicon nitride, or a high dielectric material such as hafnium oxide or hafnium silicate is formed according to a method such as a CVD method or a sputtering method so that a film thickness is about 10 to 500 [nm]. Next, a process of a patterning process is performed to form the contact hole 52A penetrating the gate insulation film 52 (the high dielectric inter-layer film).

Subsequent processes will be described with reference to FIG. 9. After the contact hole 52A is formed, the first inter-layer film 16 is formed on the gate insulation film 52 using silicon oxide, silicon nitride, or a photosensitive resin such as polyimide according to a method such as a CVD method or a spin coating method so that a film thickness is about 200 to 3000 [nm]. Thereafter, the contract holes 16A and 16B penetrating the inter-layer film 16 are formed through a patterning process. The contract hole 16A is formed to overlap the contact hole 52A penetrating through the gate insulation film 52 in a plan view (in FIG. 9, a containing state is indicated). The contact hole 16B is formed so that the contact hole 15B penetrating the inter-layer insulation film 13 is contained in a plan view.

Next, a second metal film of Mo, W, Al, Ti, Cu, or the like or an alloy film of the metal film is formed according to a method such as a sputtering method so that a film thickness is about 100 to 1500 [nm]. Thereafter, the wires $51_{\_1}$ and $51_{\_2}$ and the top gate electrode 95 are integrated as a second wire layer through a patterning process. Accordingly, the top gate electrode 95 is disposed to face the channel region 92 with the gate insulation film 52 constituted by a high dielectric inter-layer film therebetween.

Next, the second inter-layer film 53 is formed on the first inter-layer film 16 using silicon oxide, silicon nitride, or a photosensitive resin such as polyimide so that a film thickness is about 200 to 3000 [nm] according to a method such as a CVD method or a spin coating method. Thereafter, the contract portion 18 including the contact hole penetrating the second inter-layer film 53 is formed through a patterning process. Next, a metal film is formed using a sputtering method or the like to form the pixel electrode 17 through a patterning process.

As described above, the method of manufacturing the TFT structure according to Example 4 includes the process of forming the bottom gate electrode 81 and the dummy gate electrode 91, the process of forming the polysilicon layer 61 which is the semiconductor layer, the process of forming the gate insulation film 12 between both of the bottom gate electrode 81 and the dummy gate electrode 91, and the polysilicon layer 61, and the process of forming the first wire layer including the wires $14_{\_1}$ and $14_{\_2}$ and the inter-layer insulation film 13 on the polysilicon layer 61. Further, the method includes the process of forming the contact hole (opening hole) 15B in the inter-layer insulation film 13 and forming the first inter-layer film 16 and the second wire layer including the wires $51_{\_1}$ and $51_{\_2}$ on the first wire layer and the process of forming the second inter-layer film 53 and the pixel electrode 17 on the second wire layer. The contact hole 15B is opened so that the channel region 92 above the dummy gate electrode 91 to which no potential is supplied is contained in a plan view, and the top gate electrode 95 is formed in the same layer as the second wire layer in the contact hole 15B.

Advantageous Effect

In the TFT structure according to Example 4, as in the TFT structure according to Example 1, the element characteristics are able to be separately generated between the TFT 80 with the bottom gate structure and the TFT 90 with the top gate structure without adding a process as in the case in which the method of changing density of ion implantation is used. In addition, Between the TFT 90 with the top gate structure and the TFT structure according to Example 1, the shape, the material, and the like of the top gate electrode 95 are different and a different gate insulation film 52 is interposed between the channel region 92 and the top gate electrode 95. Therefore, it is possible to obtain different element characteristics from the TFT 90 according to Example 1. Further, when the film thickness or a film kind of the gate insulation film 52 is selected, it is possible to reduce an influence of the first layer including the wires $14_{\_1}$ and $14_{\_2}$ on parasitic capacitance further than the TFT 90 according to Example 1. Therefore, there is the advantage that the degree of freedom of selection is improved.

Example 5

Figure 12A:
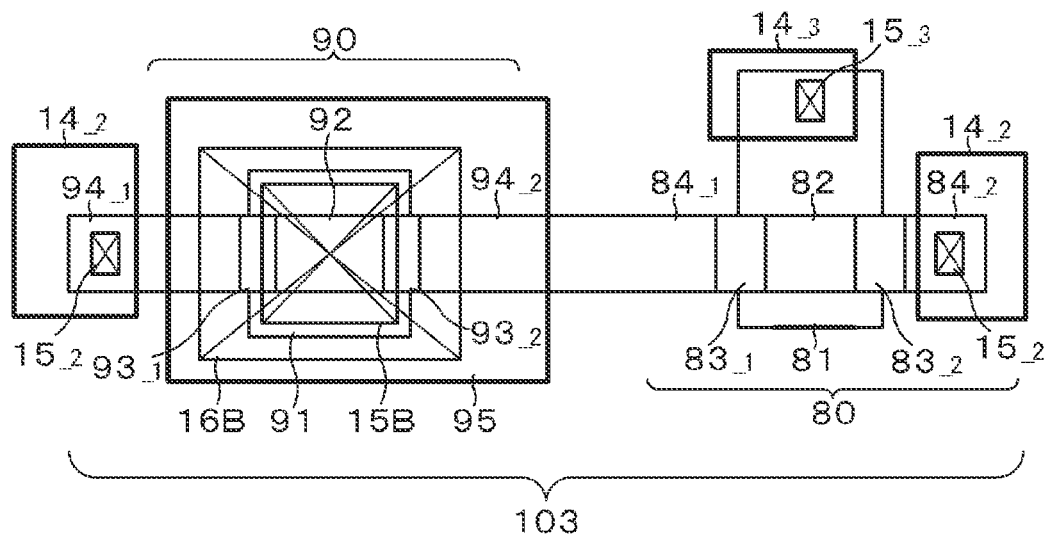
FIG. 12A is a plan view showing a TFT structure according to Example 5 and FIG. 12B is a plan view showing a TFT structure according to Example 6.

Example 5 is a modification example of Example 4. FIG. 12A is a plan view showing a TFT structure according to Example 5. Portions from the bottom gate electrode 81 and the dummy gate electrode 91 to the pixel electrode 17 are formed through the same processes as those of Example 4. The TFT structure according to Example 5 is different from the TFT structure according to Example 4 in that the source or drain region $84_{\_1}$ of the TFT 80 and the source or drain region $94_{\_2}$ of the TFT 90 are directly connected in a plan view without passing through the first wire layer including the wires $14_{\_4}$ and $14_{\_5}$ and the second wire layer including the wires $51_{\_4}$ and $51_{\_5}$. That is, the TFTs 80 and 90 are connected in series to functions as one TFT 103. The bottom gate electrode 81 of the TFT 80 and the top gate electrode 95 of the TFT 90 may have the same potential.

In this way, the TFT structure according to Example 5 is constituted such that the TFT 103 is connected in series to the TFT 80 with the bottom gate structure and the TFT 90 with the top gate structure. Accordingly, when the bottom gate electrode 81 and the top gate electrode 95 have the same potential, a threshold voltage of current definition of the TFT 101 can be the same value as a higher threshold voltage between the threshold voltages of the TFTs 80 and 90, as in the TFT structure according to Example 2. In addition, the current drive capability of the TFT 101 can be set to a value less than a lower current drive capability between the current drive capabilities of the TFTs 80 and 90.

Accordingly, in the TFT structure according to Example 5, the element characteristics are able to be separately generated in the TFT 103 having element characteristics different from those of any of the TFT 80 with the bottom gate structure and the TFT 90 with the top gate structure without adding a process as in the case in which the method of changing density of ion implantation is used.

Example 6

Figure 12B:
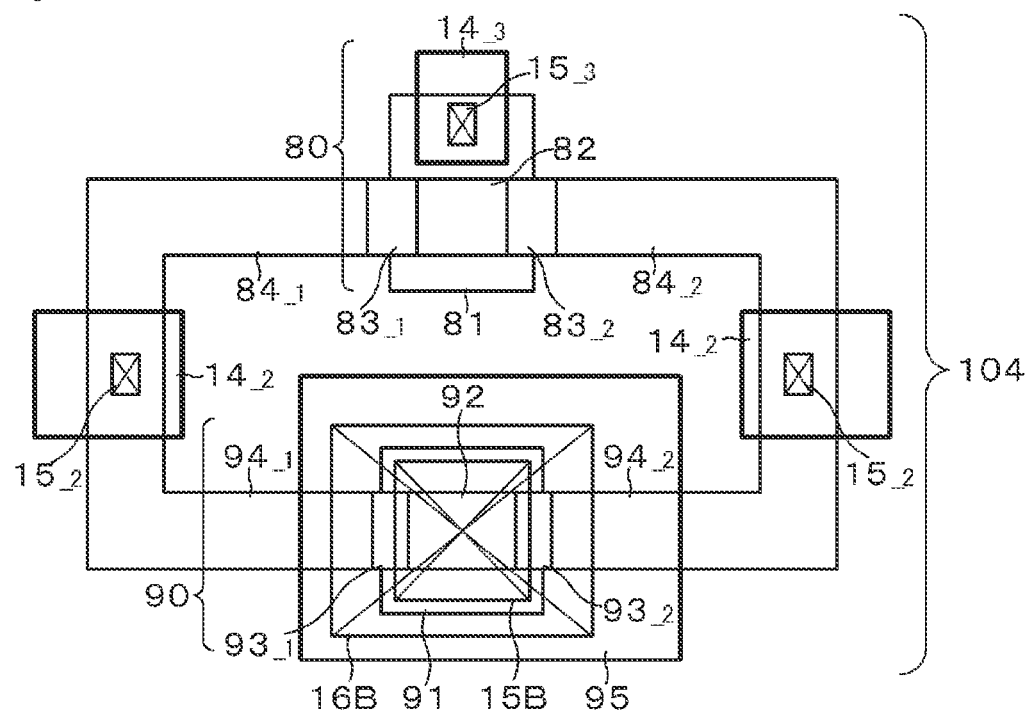

Example 6 is a modification example of Example 4. FIG. 12B is a plan view showing a TFT structure according to Example 6. Portions from the bottom gate electrode 81 and the dummy gate electrode 91 to the pixel electrode 17 are formed through the same processes as those of Example 4. Unlike Example 4, the source or drain regions $84_{\_1}$ and $84_{\_2}$ of the TFT 80 and the source or drain regions $94_{\_1}$ and $94_{\_2}$ of the TFT 90 are directly connected in a plan view without passing through the first wire layer including the wires $14_{\_4}$ and $14_{\_5}$ and the second wire layer including the wires $51_{\_4}$ and $51_{\_5}$. That is, the TFTs 80 and 90 are connected in parallel to function as one TFT 104. The bottom gate electrode 81 of the TFT 80 and the top gate electrode 95 of the TFT 90 may have the same potential.

In this way, the TFT structure according to Example 6 is constituted such that the TFT 104 is connected in parallel to the TFT 80 with the bottom gate structure and the TFT 90 with the top gate structure. Accordingly, when the bottom gate electrode 81 and the top gate electrode 95 have the same potential, a threshold voltage of current definition of the TFT 101 can be the same value as a lower threshold voltage between the threshold voltages the TFTs 80 and 90, as in the TFT structure according to Example 3. In addition, the current drive capability of the TFT 101 can be set to a value greater than a higher current drive capability between the current drive capabilities of the TFTs 80 and 90.

Accordingly, in the TFT structure according to Example 6, the element characteristics are able to be separately generated in the TFT 104 having element characteristics different from those of any of the TFT 80 with the bottom gate structure and the TFT 90 with the top gate structure without adding a process as in the case in which the method of changing density of ion implantation is used.

<Description of Second Embodiment>

In an active matrix display device such as a liquid crystal display device or an organic EL display device, a variation of element characteristics occurs in a transistor driving a light emission unit and a transistor constituting a peripheral circuit in some cases. Therefore, repairing is performed to restore pixels including transistors which do not satisfy desired characteristics (have characteristics worse than predetermined characteristics) by performing a so-called array test in a step of forming transistors and determining (ascertaining) element characteristics (pixel characteristics) of individual transistors.

In a second embodiment, in a display device in which thin film transistors (TFTs), particularly, TFTs with a bottom gate structure, are used as transistors driving light emission units and transistors constituting a peripheral circuit, an array test is assumed to be performed to ascertain the element characteristics of the individual TFTs in a step of forming the TFTs. With regard to the TFTs with the bottom gate structure of which element characteristics are determined not to satisfy desired characteristics, the pixels including the TFTs are rescued (repaired) in the array test by adding top gate electrodes to the TFTs with the bottom gate structure since sufficient element characteristics may not be obtained only with the bottom gate structure. The addition of the top gate electrodes to the TFTs with the bottom gate structure can be realized using, for example, a technology (a so-called wiring CVD method) for performing wiring when a metal thin film is formed according to a CVD method.

Hereinafter, specific examples in which a top gate electrode is added to a TFT with the bottom gate structure of which element characteristics are determined not to satisfy desired characteristics in the array test will be described.

Example 7

In Example 7, in a TFT structure in which there is only the TFT 80 with the bottom gate structure in the TFT structure according to Example 1 and there is no TFT 90 with the top gate structure, pixels including the TFTs 80 which do not satisfy desired characteristics are repaired.

[Structure]

Figure 13A:
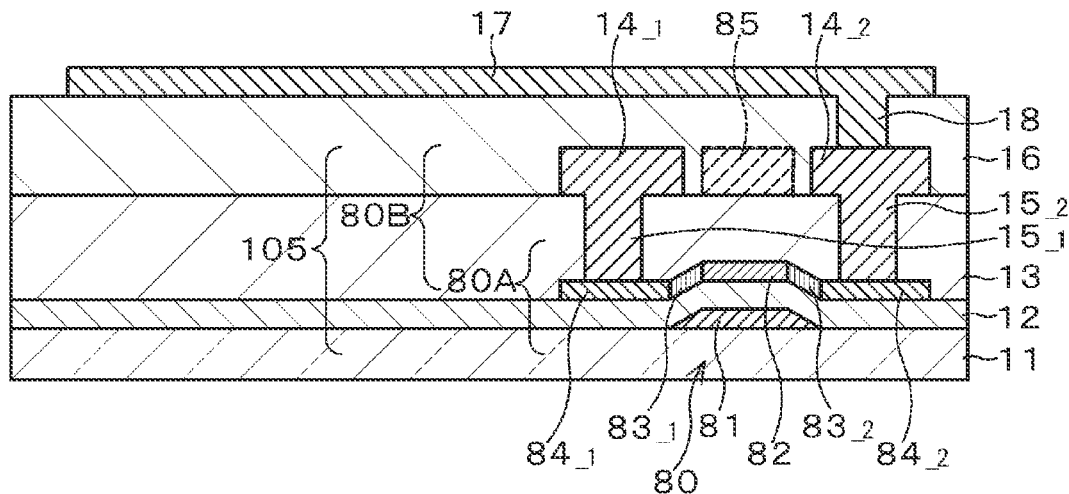
FIG. 13A is a sectional view showing a TFT structure according to Example 7 and 13B is a sectional view showing a TFT structure according to Example 7.

FIG. 13A is a sectional view showing a TFT structure according to Example 7. FIG. 13A shows a TFT structure in which a top gate electrode 85 indicated by a dotted line is added to the TFT 80 with the bottom gate structure.

In Example 7, the TFT 80 which does not satisfy desired characteristics is specified by performing the array test for determining the pixel characteristics in a step of forming portions from the bottom gate electrode 81 to the wire layer including the wires $14_{\_1}$ and $14_{\_2}$ in the TFT 80 with the bottom gate structure. In the array test, for example, the TFT 80 with the bottom gate structure in which a current drive capability is less than a predetermined value is specified as a repairing target TFT. The top gate electrode 85 is added to the repairing target TFT 80 which is determined not to satisfy the desired characteristics in the array test.

The top gate electrode 85 is provided to face the bottom gate electrode 81 of the repairing target TFT 80 with the channel region 82 interposed therebetween. The addition of the top gate electrode 85 can be realized by forming a metal film of W or the like only in a site above the channel region 82 of the TFT 80 according to a laser CVD method or using a gold paste or the like.

In the TFT structure of FIG. 13A, a TFT 80A with the bottom gate structure is constituted by the bottom gate electrode 81, the channel region 82, the LDD regions $83_{\_1}$ and $83_{\_2}$, and the source or drain regions $84_{\_1}$ and $84_{\_2}$. In addition, a TFT 80B with the top gate structure is constituted by the channel region 82, the LDD regions $83_{\_1}$ and $83_{\_2}$, the source or drain regions $84_{\_1}$ and $84_{\_2}$, and the top gate electrode 85.

Figure 13B:
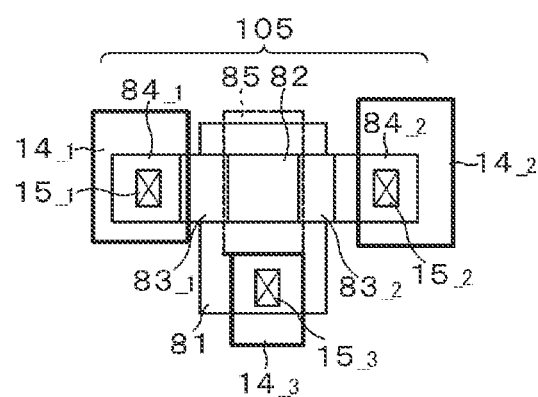

FIG. 13B is a plan view showing a TFT structure according to Example 7. FIG. 13B shows only the bottom gate electrode 81, the channel region 82, the LDD regions $83_{\_1}$ and $83_{\_2}$, the source or drain regions $84_{\_1}$ and $84_{\_2}$, the top gate electrode 85, the contact portions $15_{\_1}$, $15_{\_2}$, and $15_{\_3}$, and the wires $14_{\_1}$, $14_{\_2}$, and $14_{\_3}$ which are constituent layers of the TFT.

The top gate electrode 85 of the TFT 80B is provided to be electrically connected to the wire $14_{\_3}$ connected to the bottom gate electrode 81 of the TFT 80A in the contact portion $15_{\_3}$. Accordingly, the TFT 80A with the bottom gate structure and the TFT 80B with the top gate structure which are located above and below each other with the channel region 82 interposed therebetween function as the TFT 105 with a laminated structure in which the bottom gate structure and the top gate structure are laminated, in other words, function as the TFT 105 with a bottom/top both-sided gate structure.

[Manufacturing Method]

Portions from the bottom gate electrode 81 to the wire layer including the wires $14_{\_1}$ and $14_{\_2}$ are formed through the same processes as those of Example 1. In this step, the TFT 80A with the bottom gate structure is formed. When the wire layer including the wires $14_{\_1}$ and $14_{\_2}$ is formed, the top gate electrode 85 is not yet formed.

In a step of forming the TFT 80A with the bottom gate structure, the array test for determining the pixel characteristics is performed to specify the TFT 80A which does not satisfy the desired characteristics, for example, the TFT 80A with the bottom gate structure of which the current drive capability is less than the predetermined value. Subsequently, a metal film of W or the like is formed only in a site above the channel region 82 of the TFT 80A according to a laser CVD method or using a gold paste or the like to form the top gate electrode 85 so that a film thickness is about 50 to 500 [nm]. At this time, the top gate electrode 85 is formed so that the channel region 82 is contained in a plan view. Accordingly, the top gate electrode 85 functions as the top gate electrode of the TFT 80B. After the top gate electrode 85 is formed, portions from the inter-layer film 16 to the pixel electrode 17 are formed through the same processes as those of Example 1.

As described above, the method of manufacturing the TFT structure according to Example 7 includes the process of forming the bottom gate electrode 81, the process of forming the polysilicon layer 61, the process of forming the gate insulation film 12 between both of the bottom gate electrode 81 and the polysilicon layer 61, and the process of forming the wire layer including the wires $14_{\_1}$ and $14_{\_2}$ and the inter-layer insulation film 13 on the polysilicon layer 61.

The method further includes the process of performing the array test and the wiring and the process of forming the inter-layer film 16 and the pixel electrode 17 on the wire layer including the wires $14_{\_1}$ and $14_{\_2}$. The top gate electrode 85 is formed in the same layer as the wire layer including the wires $14_{\_1}$ and $14_{\_2}$ above the bottom gate electrode 81 with the channel region 82 interposed therebetween so that the channel region 82 is contained in a plan view.

Advantageous Effect

As described above, the top gate electrode 85 is added in the same layer as the wire layer including the wires $14_{\_1}$ and $14_{\_2}$ to the repairing target TFT 80A of which the current drive capability is less than the predetermined value and which is determined not to satisfy the desired characteristics according to, for example, the laser CVD method in the array test. Accordingly, since the TFT 105 according to Example 7 has the laminated structure (bottom/top both-sided gate structure) of the TFT 80A with the bottom gate structure and the TFT 80B with the top gate structure, it is possible to improve the current drive capability more than in the TFT 80A with only the bottom gate structure. By improving the current drive capability, it is possible to correct the characteristics of the TFT 80A with the original bottom gate structure of which sufficient element characteristics are unobtainable in only the bottom gate structure. That is, it is possible to repair the pixel that includes the TFT 80A with the bottom gate structure which does not satisfy the desired characteristics.

Example 8

Figure 14A:
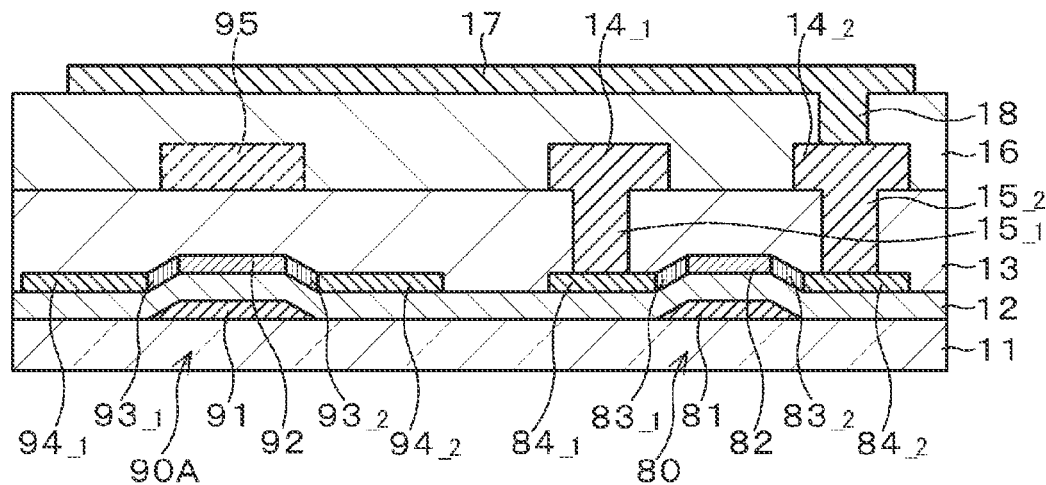
FIG. 14A is a plan view showing a TFT structure according to Example 8 and FIG. 14B is a plan view showing the TFT structure according to Example 8.

In Example 8, not only the TFT 80 with the bottom gate structure but also the dummy gate electrode 91 are included in the TFT structure according to Example 1, but it is assumed that a TFT with a structure which does not include the top gate electrode 95 is included as a redundant TFT 90A (see FIG. 14A). When the TFT 80 with the bottom gate structure has a critical defect such as leakage between a source and a drain and a pixel including the TFT 80 becomes, for example, a defect pixel such as a bright spot, the repairing target TFT 80 having the defect is broken. A top gate electrode is added to the redundant TFT 90A which is another TFT provided on the same glass substrate 11 as the repairing target TFT 80. The redundant TFT 90A with the top gate structure is used instead of the TFT 80. In this case, as in Example 3 shown in FIG. 8B, it is assumed that the redundant TFT 90A is connected in parallel to the repairing target TFT 80 with the bottom gate structure.

[Structure]

FIG. 14A is a sectional view showing a TFT structure according to Example 8. The TFT structure according to Example 8 includes the redundant TFT 90A and the TFT 80 with the bottom gate structure. When it is determined that the TFT 80 with the bottom gate structure has a critical defect such as leakage between a source and a drain in an array test for determining pixel characteristics, the redundant TFT 90A has a function of a TFT with the top gate structure by including the top gate electrode 95 added later and indicated by a dotted line in FIG. 14A.

Figure 14B:
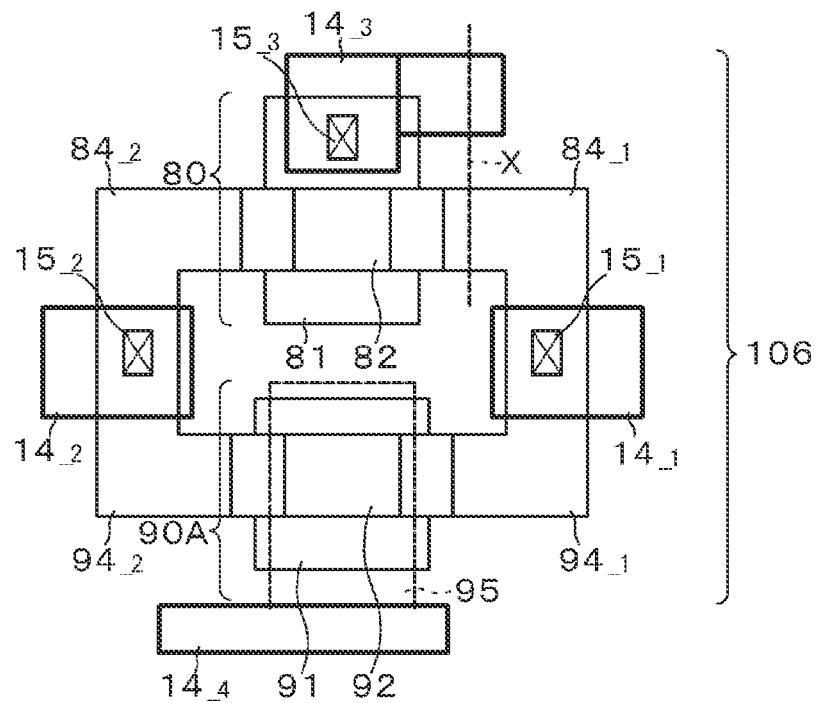

FIG. 14B is a plan view showing a TFT structure according to Example 8. FIG. 14B shows only the bottom gate electrode 81, the dummy gate electrode 91, the top gate electrode 95, the channel regions 82 and 92, the LDD regions $83_{\_1}$, $83_{\_2}$, $93_{\_1}$, and $93_{\_2}$, the source or drain regions $84_{\_1}$, $84_{\_2}$, $94_{\_1}$, and $94_{\_2}$, the contact portions $15_{\_1}$, $15_{\_2}$, and $15_{\_3}$, and the wires $14_{\_1}$, $14_{\_2}$, and $14_{\_3}$ which are constituent layers of the TFT.

A disconnection process is performed using a laser repairing technology on the TFT 80 with the bottom gate structure determined to have a critical defect such as leakage between a source and a drain in an array test. A laser repair site of disconnection from the TFT 80 is indicated by a dotted line X in FIG. 14B. The laser repairing disconnection may be performed on the source or drain region $84_{\_1}$ or $84_{\_2}$ of the TFT 80, the bottom gate electrode 81, or the wire 143 connected to the bottom gate electrode 81 in the contact portion $15_{\_3}$.

The top gate electrode 95 is connected to the wire $14_{\_4}$ supplying a gate voltage of the redundant TFT 90A and the gate electrode 91 is a dummy gate electrode. Accordingly, the redundant TFT 90A functions as a TFT with the top gate structure. The top gate electrode 95 may have the same potential as the bottom gate electrode 81. The TFT 80 with the bottom gate structure and the redundant TFT 90A are connected in parallel. Accordingly, the characteristics of the TFT 106 (with the TFT structure according to Example 8) after the laser repairing disconnection from the TFT 80 and the formation of the top gate electrode 95 of the redundant TFT 90A are identical to the characteristics of the redundant TFT 90A with the top gate structure.

[Manufacturing Method]

Portions from the bottom gate electrode 81 and the dummy gate electrode 91 to the wire layer including the wires $14_{\_1}$ and $14_{\_2}$ are formed through the same processes as those of Example 1. The TFT 80 has the bottom gate structure and the redundant TFT 90A has the top gate structure, but the top gate electrode 95 of the redundant TFT 90A is not formed when the wire layer including the wires $14_{\_1}$ and $14_{\_2}$ is formed unlike Example 1.

In a step of forming the wire layer including the wires $14_{\_1}$ and $14_{\_2}$, an array test for determining the pixel characteristics is performed to specify the TFT 80 which does not satisfy the desired characteristics. In this example, the TFT 80 having a critical defect such as leakage between a source and a drain is specified as the TFT which does not satisfy the desired characteristics. The TFT 80 specified as the TFT which does not satisfy the desired characteristics is disconnected using laser repairing.

Next, a metal film of W or the like is formed only in a site in which the top gate electrode 95 of the redundant TFT 90A is disposed according to a laser CVD method or using a gold paste or the like to form the top gate electrode 95 so that a film thickness is about 50 to 500 [nm]. At this time, the top gate electrode 95 is formed so that the channel region 92 is contained in a plan view. Accordingly, the top gate electrode 95 to be added subsequently functions as the top gate electrode of the redundant TFT 90A. After the top gate electrode 95 is formed, portions from the inter-layer film 16 to the pixel electrode 17 are formed through the same processes as those of Example 1.

As described above, as in Example 1, the method of manufacturing the TFT structure according to Example 8 includes the process of forming the bottom gate electrode 81, the process of forming the polysilicon layer 61, the process of forming the gate insulation film 12 between both of the bottom gate electrode 81 and the polysilicon layer 61, and the process of forming the wire layer including the wires $14_{\_1}$ and $14_{\_2}$ and the inter-layer insulation film 13 on the polysilicon layer 61. The method further includes the process of performing the array test and the wiring and the process of forming the inter-layer film 16 and the pixel electrode 17 on the wire layer including the wires 14_1 and 14_2. Above the dummy gate electrode 91 to which no potential is supplied in a layer below the channel region 92 connected to the source or drain region 84_2 of the TFT 80 disconnected in the laser repairing process, the top gate electrode 95 is formed in the same layer as the wire layer including the wires 14_1 and 14_2 with the channel region 92 interposed therebetween so that the channel region 92 is contained in a plan view.

Advantageous Effect

In the TFT structure according to Example 8, after pixel darkening is performed once by fracturing the TFT 80 with the bottom gate structure determined to have a critical defect such as a leakage between a source and a drain, the top gate electrode 95 is added to the redundant TFT 90A in the same layer as the wire layer including the wires 14_1 and 14_2. Accordingly, in order to cause the redundant TFT 90A to function as the TFT with the top gate structure, a pixel with a bright spot defect caused in the TFT 80 with the bottom gate structure having a critical defect such as leakage between a source and a drain can be rescued (repaired).

Example 9

Example 9 is a modification example of Example 7. The technology according to Example 7 is applied to a TFT structure which is a two-layer structure of a wire layer and an inter-layer film.
[Structure]

Figure 15A:
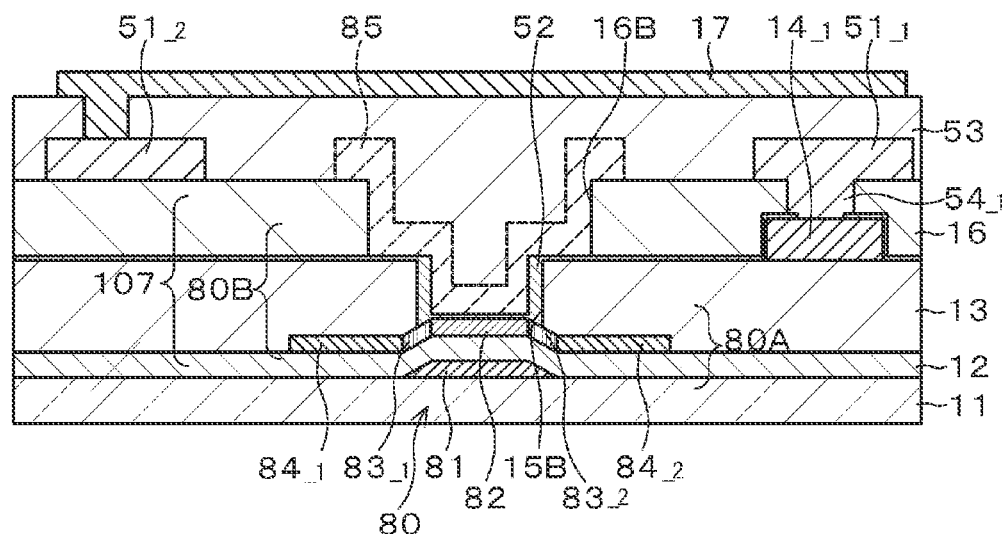
FIG. 15A is a plan view showing a TFT structure according to Example 9 and FIG. 15B is a plan view showing the TFT structure according to Example 9.

FIG. 15A is a sectional view showing a TFT structure according to Example 9. FIG. 15A shows a TFT structure after the top gate electrode 85 indicated by a dotted line and having a different shape or the like from Example 7 is added to the TFT 80 with the bottom gate structure.

In the TFT structure according to Example 9, the TFT 80 with the bottom gate structure has basically the same structure as the TFT 90 of the TFT structure according to Example 4 shown in FIG. 9. Here, as in Example 7, the top gate electrode 85 is added later to the TFT 80 with the bottom gate structure determined not to satisfy the desired characteristics in an array test.

In the TFT structure of FIG. 15A, the TFT 80A with the bottom gate structure is constituted by the bottom gate electrode 81, the channel region 82, the LDD regions 83_1 and 83_2, and the source or drain regions 84_1 and 84_2. In addition, the TFT 80B with the top gate structure is constituted by the channel region 82, the LDD regions 83_1 and 83_2, the source or drain regions 84_1 and 84_2, and the top gate electrode 85.

Figure 15B:
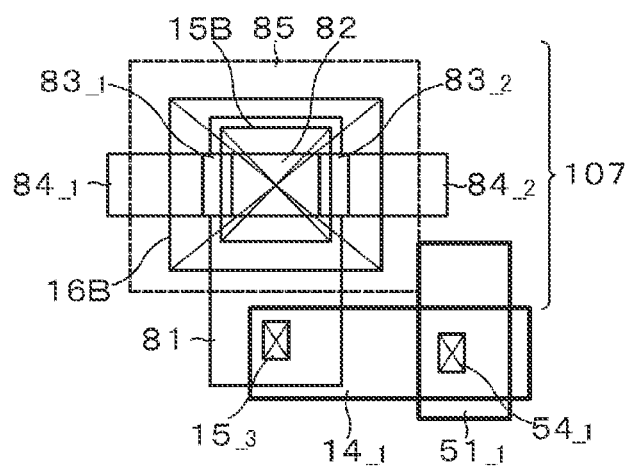

FIG. 15B is a plan view showing a TFT structure according to Example 9. FIG. 15B shows only the bottom gate electrode 81, the top gate electrode 85, the channel region 82, the LDD regions 83_1 and 83_2, the source or drain regions 84_1 and 84_2, the contact holes 15B and 16B, the contact portions 15_3 and 54_1, and the wires 14_1 and 51_1 which are constituent layers of the TFT.

The top gate electrode 85 of the TFT 80B is provided to be electrically connected to the wire 14_1 connected to the bottom gate electrode 81 of the TFT 80A via the contact portion 153. To be specific, the top gate electrode 85 is electrically connected to the wire 51_1 connected to the wire 14_1 via the contact portion 54_1. Accordingly, the TFT 80A with the bottom gate structure and the TFT 80B with the top gate structure which are located above and below each other with the channel region 82 interposed therebetween function as a TFT 107 with a laminated structure in which both of the TFTs 80A and 80B are laminated, in other words, the TFT 107 with a bottom/top both-sided gate structure.
[Manufacturing Method]

Portions from the bottom gate electrode 81 to the wire layer including the wires 51_1 and 51_2 are formed through the same processes as those of Example 1. The TFT 80A has the bottom gate structure. Unlike Example 4, the top gate electrode 85 is not formed when the wire layer including the wires 51_1 and 51_2 is formed.

In a step of forming the TFT 80A with the bottom gate structure, the array test for determining the pixel characteristics is performed to specify the TFT 80A which does not satisfy the desired characteristics, for example, the TFT 80A with the bottom gate structure of which the current drive capability is less than the predetermined value. Subsequently, a metal film of W or the like is formed only in a site above the channel region 82 of the TFT 80A according to a laser CVD method or using a gold paste or the like to form the top gate electrode 85 so that a film thickness is about 50 to 500 [nm]. At this time, the top gate electrode 85 is formed so that the channel region 82 is contained in a plan view. Accordingly, the top gate electrode 85 functions as a gate electrode of the TFT 80B with the top gate structure. After the top gate electrode 85 is formed, portions from the inter-layer film 53 to the pixel electrode 17 are formed through the same processes as those of Example 4.

As described above, as in Example 4, the method of manufacturing the TFT structure according to Example 9 includes the process of forming the bottom gate electrode 81, the process of forming the polysilicon layer 61 which is the semiconductor layer, the process of forming the gate insulation film 12 between both of the bottom gate electrode 81 and the polysilicon layer 61, and the process of forming the wire layer including the wires 14_1 and 14_2 and the inter-layer insulation film 13 on the polysilicon layer 61. Further, the method includes the process of forming the contact hole (opening hole) 15B in the inter-layer insulation film 13, the process of forming the first inter-layer film 16 and the second wire layer including the wires 51_1 and 51_2 on the first wire layer, and the process of forming the second inter-layer film 53 and the pixel electrode 17 on the second wire layer. The contact hole 15B is opened so that the channel region 82 above the bottom gate electrode 81 is contained in a plan view, and the top gate electrode 85 is formed in the same layer as the second wire layer in the contact hole 15B.

Advantageous Effect

In the TFT structure according to Example 9, for example, the top gate electrode 85 is added in the same layer as the second wire layer including the wires 51_1 and 51_2 according to, for example, a laser CVD method to the TFT 80A with the bottom gate structure of which the current drive capability is less than the predetermined value and which is determined not to satisfy the desired characteristics in the array test. Accordingly, since the TFT 80A with the bottom gate structure and the TFT 80B with the top gate structure function as the TFT 107 with the laminated structure of the TFTs 80A and 80B, the current drive capability can be improved more than in the TFT 80A with only the bottom gate structure. By improving the current drive capability, it is possible to correct the characteristics of the TFT 80A with the original bottom gate structure of which sufficient element characteristics are unobtainable in only the bottom gate structure. In addition, the TFT 80B with the top gate structure has a different shape, material or the like of the top gate electrode 85 from the TFT 80B according to Example 7. Further, since a different gate insulation film 52 is interposed between the channel region 82 and the top gate electrode 85, it is possible to obtain different element characteristics from the TFT 80B according to Example 7.

Example 10

Figure 16:
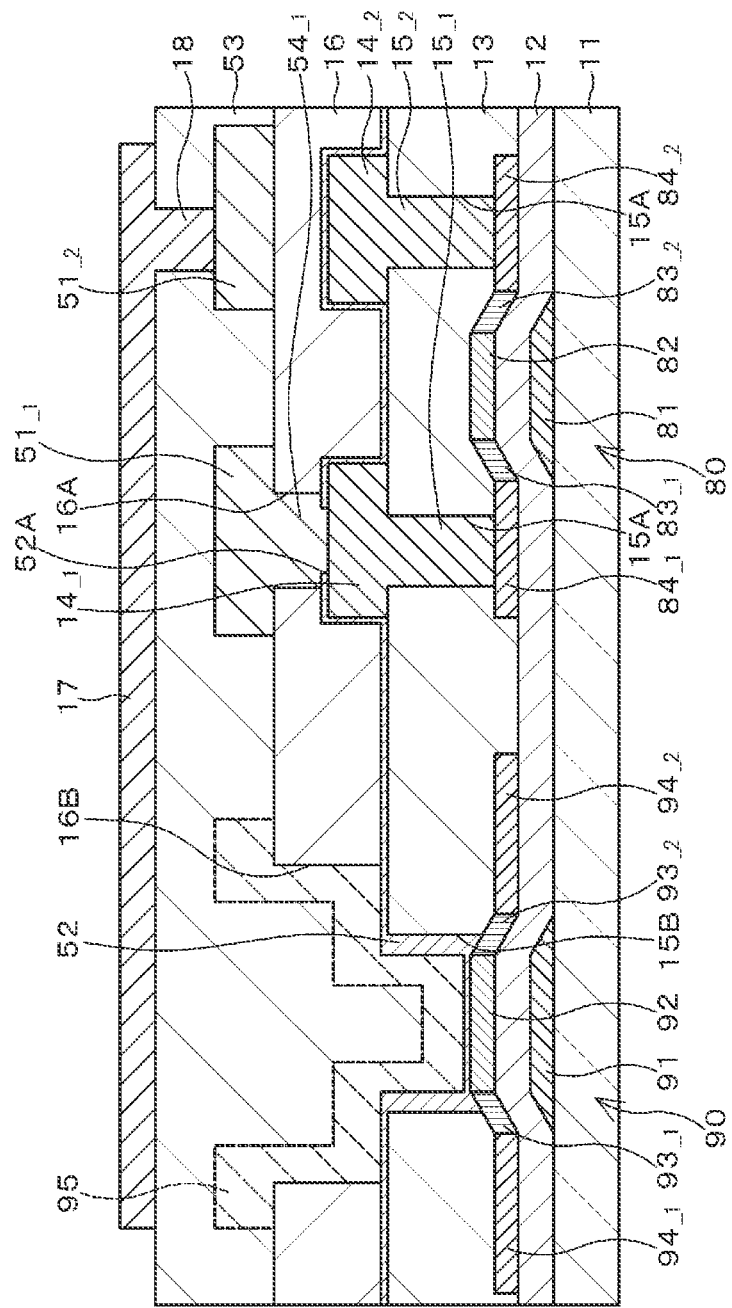
FIG. 16 is a sectional view showing a TFT structure according to Example 10.

Example 10 is another modification example of Example 7. The technology according to Example 7 is applied to a TFT structure that has a two-layer structure of a wire layer and an inter-layer film and has the same structure as the TFT structure according to Example 4 shown in FIG. 9.
[Structure]
FIG. 16 is a sectional view showing a TFT structure according to Example 10. The TFT structure according to Example 10 includes the TFT 80 with the bottom gate structure and the TFT 90 including the dummy gate electrode 91 as in the TFT structure according to Example 4. In Example 10, the technology according to Example 9 is applied to the TFT 90. By applying the technology according to Example 9, the top gate electrode 95 is added later to the TFT 90 in a laser repairing process after the array test. The TFT 90 has the top gate structure by adding the top gate electrode 95. FIG. 16 shows the TFT structure after the top gate electrode 95 indicated by a dotted line is added.

Figure 17:
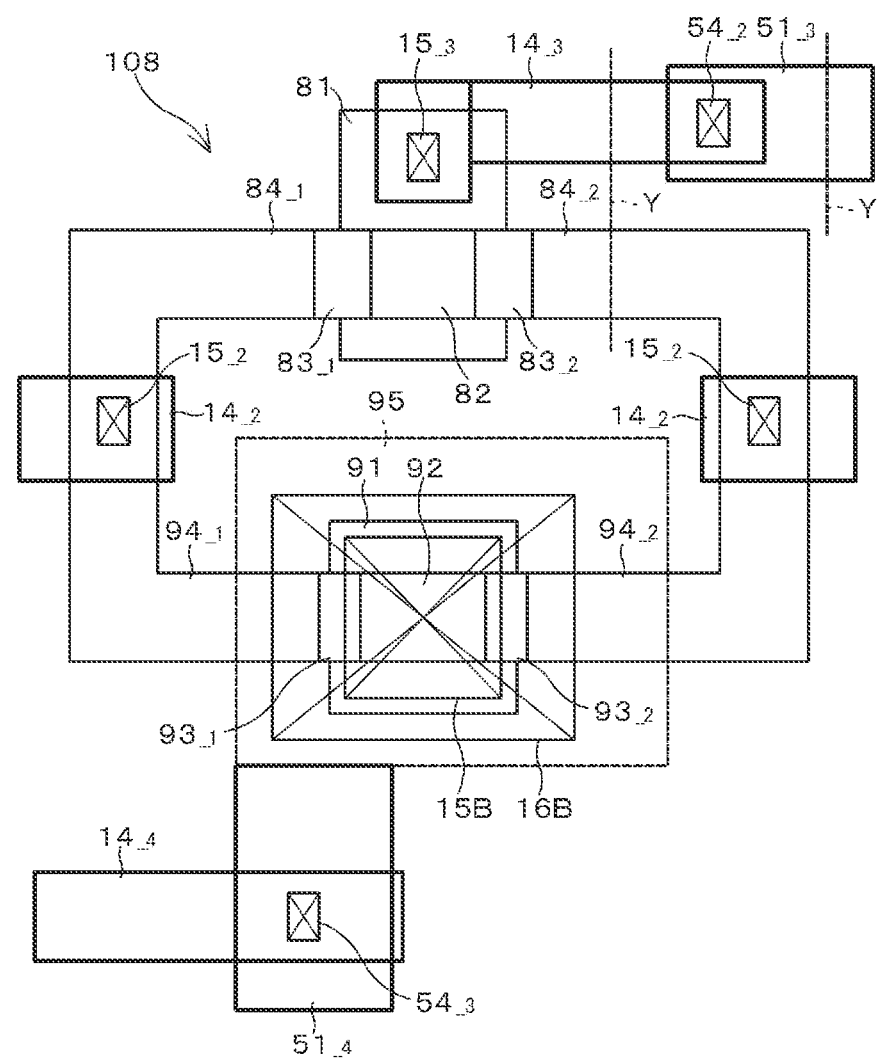
FIG. 17 is a sectional view showing a TFT structure according to Example 10.

FIG. 17 is a plan view showing a TFT structure according to Example 10. FIG. 17 shows only the bottom gate electrode 81, the dummy gate electrode 91, the top gate electrode 95, the channel regions 82 and 92, the LDD regions $83\_1$, $83\_2$, $93\_1$, and $93\_2$, the source or drain regions $84\_1$, $84\_2$, $94\_1$, and $94\_2$, the contact portions $15\_2$, $15\_3$, $54\_2$, and $54\_3$ and the wires $14\_2$, $14\_3$, $14\_4$, $51\_3$, and $51\_4$ which are constituent layers of the TFT.

A disconnection process is performed using a laser repairing technology on the TFT 80 with the bottom gate structure determined to have a critical defect such as leakage between a source and a drain in an array test. A laser repair site of disconnection from the TFT 80 is indicated by a dotted line Y in FIG. 17. The laser repairing disconnection may be performed on the source or drain region $84\_1$ or $84\_2$ of the TFT 80, the bottom gate electrode 81, or one of the wire $14\_3$ connected to the bottom gate electrode 81 via the contact portion $15\_3$ and the wire $51\_3$ connected to the wire $14\_3$ via the contact portion $54\_2$.

The top gate electrode 95 is connected to the first wire $14\_4$ supplying a gate voltage of the TFT 90 via the second wire 514 and the contact portion $54\_3$. Since the gate electrode (bottom gate electrode) 91 is a dummy gate electrode, the TFT 90 has the top gate structure. The top gate electrode 95 may have the same potential as the bottom gate electrode 81. The TFTs 80 and 90A are connected in parallel. Accordingly, after the laser repairing disconnection from the TFT 80 and the formation of the top gate electrode 95 of the TFT 90, the element characteristics of the TFT 108 constituted by parallel connection of the TFTs 80 and 90 are identical to the characteristics of the TFT 90A.
[Manufacturing Method]
Portions from the bottom gate electrode 81 and the dummy gate electrode 91 to the wire layer including the wires $51\_1$ and $51\_2$ are formed through the same processes as those of Example 4. Unlike Example 4, when the wire layer including the wires $51\_1$ and $51\_2$ is formed, the top gate electrode 95 is not yet formed.

In a step of forming the TFT 80 with the bottom gate structure, the array test for determining the pixel characteristics is performed to specify the TFT 80 which does not satisfy the desired characteristics, for example, the TFT 80 with the bottom gate structure which has a critical defect such as a leakage between a source and a drain. The array test and the laser repairing may be performed after the wire layer including the wires $51\_1$ and $51\_2$ is formed, as in Example 8.

Subsequently, a metal film of W or the like is formed only in a site in which the top gate electrode 95 of the TFT 90 is disposed according to a laser CVD method or using a gold paste or the like to form the top gate electrode 95 so that a film thickness is about 50 to 500 [nm]. At this time, the top gate electrode 95 is formed so that the channel region 92 is contained in a plan view. Accordingly, the top gate electrode 95 functions as the top gate electrode of the TFT 90. After the top gate electrode 95 is formed, portions from the inter-layer film 53 to the pixel electrode 17 are formed through the same processes as those of Example 4.

As described above, as in Example 4, the method of manufacturing the TFT structure according to Example 10 includes the process of forming the bottom gate electrode 81 and the dummy gate electrode 91, the process of forming the polysilicon layer 61 which is the semiconductor layer, the process of forming the gate insulation film 12 between both of the bottom gate electrode 81 and the dummy gate electrode 91, and polysilicon layer 61, and the process of forming the first wire layer including the wires $14\_1$ and $14\_2$ and the inter-layer insulation film 13 on the polysilicon layer 61. Further, the method includes the process of forming the contact hole (opening hole) 15B in the inter-layer insulation film 13 and the process of forming the second wire layer including the wires $51\_1$ and $51\_2$ and the first inter-layer film 16 on the first wire layer and the process of forming the second inter-layer film 53 and the pixel electrode 17 on the second wire layer. Above the dummy gate electrode 91 to which no potential is supplied in a layer below the channel region 92 connected to the source or drain region $84\_2$ of the TFT 80 disconnected in the laser repairing process, the top gate electrode 95 is formed in the same layer as the second wire layer including the wires $51\_1$ and $51\_2$ with the channel region 92 interposed therebetween so that the channel region 92 is contained in a plan view.

Advantageous Effect

In the TFT structure according to Example 10, after pixel darkening is performed once by fracturing the TFT 80 with the bottom gate structure determined to have a critical defect such as a leakage between a source and a drain, the top gate electrode 95 is added to the redundant TFT 90 connected in parallel to the TFT 80 in the same layer as the second wire layer including the wires $51\_1$ and $51\_2$. Accordingly, since the TFT 90 functions as the TFT with the top gate structure, for example, a pixel with a bright spot defect caused in the TFT 80 with the bottom gate structure having a critical defect such as leakage between a source and a drain can be rescued.
<Description of Third Embodiment>
A third embodiment is a modification example of the first embodiment. The third embodiment is the same as the first embodiment in that the TFT 80 with the bottom gate structure and the TFT 90 with the top gate structure are included on the same glass substrate 11 and the top gate electrode 95 of the TFT 90 is provided in the same layer as the wire layer including the wires $14\_1$ and $14\_2$. However, the third embodiment is different from the first embodiment in that the TFT 90 does not include the dummy gate electrode 91. Hereinafter, a specific example will be described as Example 11.

Example 11

[Structure]

Figure 18:
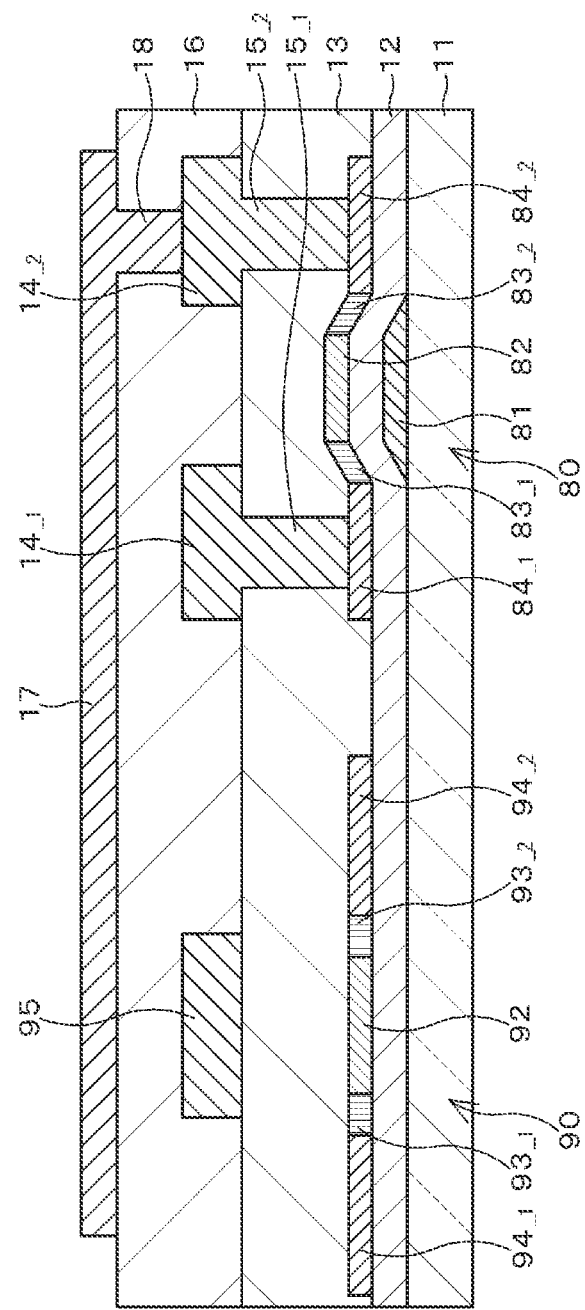
FIG. 18 is a sectional view showing a TFT structure according to Example 11.

FIG. 18 is a sectional view showing a TFT structure according to Example 1. In FIG. 18, the TFT 80 with the bottom gate structure and the TFT 90 with the top gate structure are provided on an insulation transparent substrate, for example, the glass substrate 11.

The TFT 80 with the bottom gate structure includes the bottom gate electrode 81 provided on the glass substrate 11, the channel region 82 provided to face the bottom gate electrode 81 via the gate insulation film 12, and the LDD regions $83_{\_1}$ and $83_{\_2}$ and the source or drain regions $84_{\_1}$ and $84_{\_2}$ provided on both sides of the channel region 82. The inter-layer insulation film 13 is provided on the channel region 82, the LDD regions $83_{\_1}$ and $83_{\_2}$, and the source or drain regions $84_{\_1}$ and $84_{\_2}$. The wires $14_{\_1}$ and $14_{\_2}$ are provided on the inter-layer insulation film 13. The wires $14_{\_1}$ and $14_{\_2}$ are electrically connected to the source or drain regions $84_{\_1}$ and $84_{\_2}$ via the contact portions $15_{\_1}$ and $15_{\_2}$ provided to penetrate through the inter-layer insulation film 13.

The TFT 90 with the top gate structure is provided on the glass substrate 11, as in the bottom gate electrode 81. The TFT 90 with the top gate structure includes the channel region 92 provided on the gate insulation film 12, the LDD regions $93_{\_1}$ and $93_{\_2}$ and the source or drain regions $94_{\_1}$ and $94_{\_2}$ provided on both sides of the channel region 92, and the top gate electrode 95 provided on the inter-layer insulation film 13 to face the channel region 92. The top gate electrode 95 is provided in the same layer as a wire layer in which the wires $14_{\_1}$ and $14_{\_2}$ are formed.

The wire layer including the wires $14_{\_1}$ and $14_{\_2}$ and the top gate electrode 95 are covered with the inter-layer film 16. The pixel electrode 17 is provided on the inter-layer film 16. The pixel electrode 17 is electrically connected to the wire $51_{\_2}$ via the contact portion 18 provided to penetrate through the inter-layer film 16.

Figure 19:
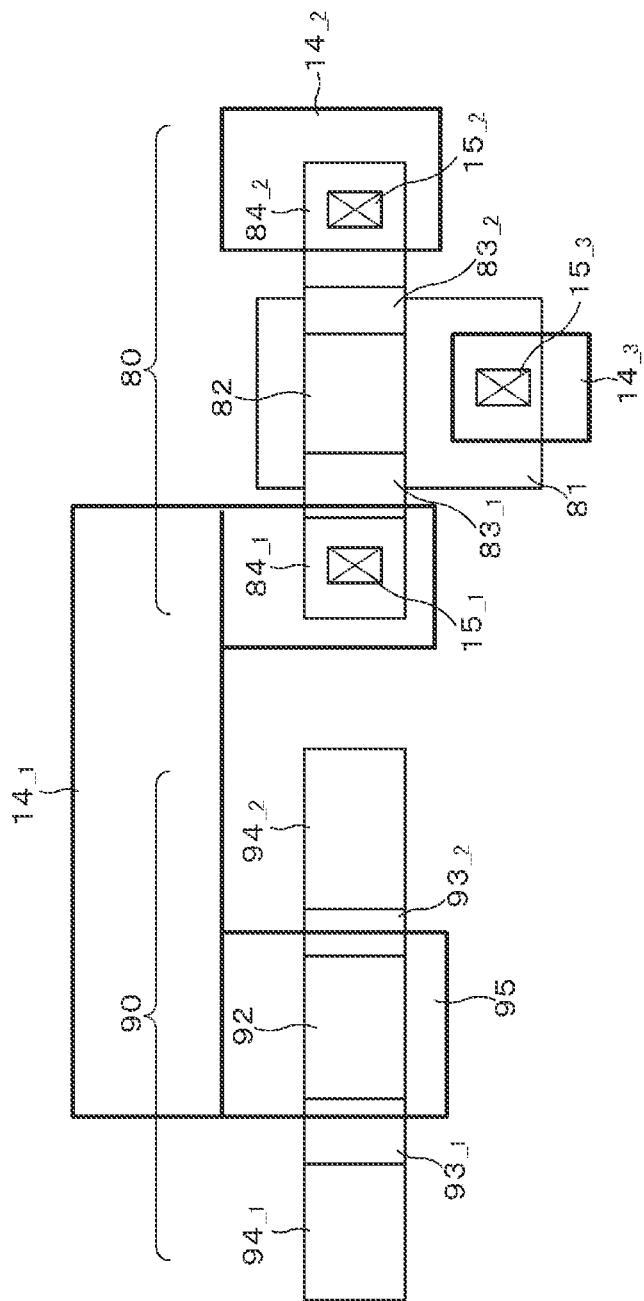
FIG. 19 is a sectional view showing a TFT structure according to Example 11.

FIG. 19 is a plan view showing a TFT structure according to Example 11. FIG. 19 shows only the bottom gate electrode 81, the top gate electrode 95, the channel regions 82 and 92, the LDD regions $83_{\_1}$, $83_{\_2}$, $93_{\_1}$, and $93_{\_2}$ the source or drain regions $84_{\_1}$, $84_{\_2}$, $94_{\_1}$, and $94_{\_2}$, the contact portions $15_{\_1}$, $15_{\_2}$, and $15_{\_3}$, and the wires $14_{\_1}$, $14_{\_2}$, and $14_{\_3}$ which are constituent layers of the TFT.

The top gate electrode 95 of the TFT 90 with the top gate structure is integrated by extending from the wire $14_{\_1}$ connected to the contact portion $15_{\_1}$ to one source or drain region $84_{\_1}$ of the TFT 80 with the bottom gate structure. In addition, the bottom gate electrode 81 of the TFT 80 with the bottom gate structure functions as a gate electrode by supplying a potential via the wire $14_{\_3}$ and the contact portion $15_{\_3}$.

[Manufacturing Method]

Next, a method of manufacturing the TFT structure according to Example 11 will be described with reference to process diagrams of FIGS. 20A to 20C.

Figure 20A:
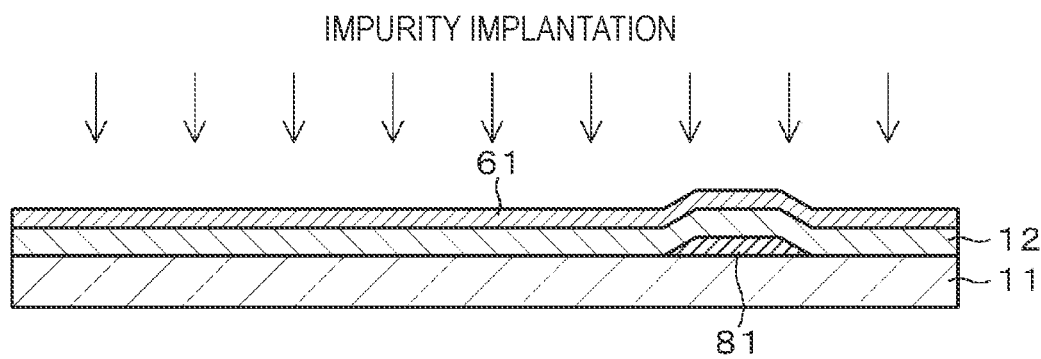
FIGS. 20A to 20C are process diagrams showing a procedure of a method of manufacturing the TFT structure according to Example 11.

(Process of FIG. 20A)

The bottom gate electrode 81 is formed by forming a metal film of Mo, W, Al, Ti, Cu, or the like or an alloy thin film of the metal which becomes the bottom gate electrode 81 on the glass substrate 11 so that a thin thickness is about 10 to 500 [nm] according to a method such as a sputtering method and performing a patterning process. That is, unlike Example 1, the bottom gate electrode 91 (see FIG. 5A) is not formed.

Next, the gate insulation film 12 is formed by forming a silicon oxide film, a silicon nitride film, or a laminated film of a silicon oxide film and a silicon nitride film so that a thin thickness is about 20 to 500 [nm] according to a method such as a CVD method. Thereafter, an amorphous silicon layer is formed on the gate insulation film 12 so that a film thickness is about 20 to 200 [nm] according to a method such as a CVD method and the amorphous silicon is crystallized using ELA or the like. Subsequently, the polysilicon layer 61 which becomes the channel regions 82 and 92 is formed by performing appropriate impurity implantation. The polysilicon layer 61 may be directly formed according to CVD without performing the ELA.

Figure 20B:
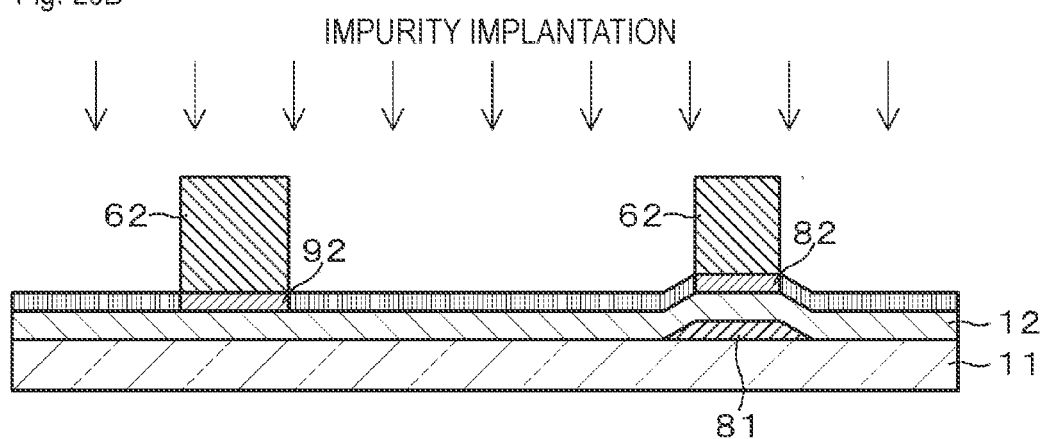

(Process of FIG. 20B)

Next, a photoresist 62 is applied to perform a lithography process from the upper surface direction of the glass substrate 11 and patterning is performed on the photoresist 62. Subsequently, the channel regions 82 and 92 of the TFTs 80 and 90 are formed by performing necessary impurity implantation using the patterned photoresist 62 as a mask. As in Example 1, back exposure may be performed on the channel region 82 using the bottom gate electrode 81.

Figure 20C:
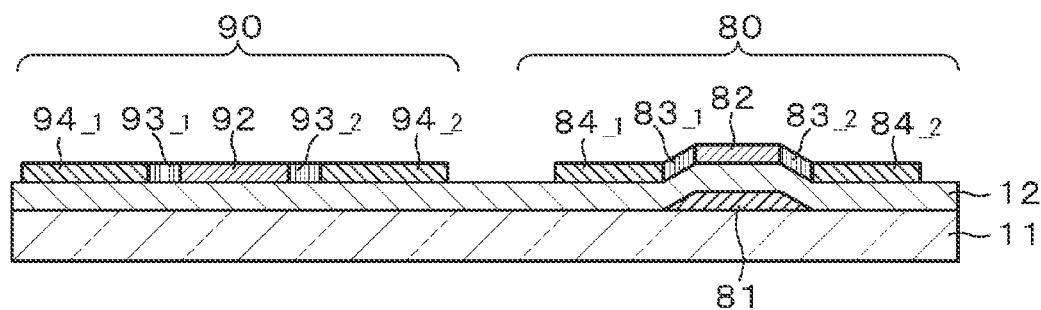

(Process of FIG. 20C)

Next, the LDD regions $83_{\_1}$, $83_{\_2}$, $93_{\_1}$, and $93_{\_2}$ and the source or drain regions $84_{\_1}$, $84_{\_2}$, $94_{\_1}$, and $94_{\_2}$ of the TFTs 80 and 90 are formed by performing an appropriate lithography process and impurity implantation. Thereafter, the TFT 80 with the bottom gate structure and the TFT 90 with the top gate structure are formed by separating the semiconductor layer through an impurity activation process and a process of patterning the polysilicon layer 61.

Subsequent processes will be described with reference to FIG. 18. After the TFT 80 with the bottom gate structure and the TFT 90 with the top gate structure are formed, the inter-layer insulation film 13 is formed by forming a silicon oxide film, a silicon nitride film, or a laminated film of a silicon oxide film and a silicon nitride film so that a film thickness is about 50 to 1500 [nm] according to a method such as a CVD method. Subsequently, the contact portions $15_{\_1}$, $15_{\_2}$, and $15_{\_3}$ including the contact holes that penetrate through the inter-layer insulation film 13 are formed through a patterning process. Then, making contact to the semiconductor layer (the source or drain regions $84_{\_1}$ and $84_{\_2}$) via the contact portions $15_{\_1}$ and $15_{\_2}$ is performed and contact to the bottom gate electrode 81 by the contact portion $15_{\_3}$ is simultaneously performed (see FIG. 19).

Subsequently, a metal film of Mo, W, Al, Ti, Cu, or the like or an alloy film of the metal film of about 100 to 1500 [nm] is formed on the inter-layer insulation film 13 and the contact portions $15_{\_1}$, $15_{\_2}$, and $15_{\_3}$ according to a method such as a sputtering method. Thereafter, the wires $14_{\_1}$ and $14_{\_2}$ and the top gate electrode 95 are integrated through a patterning process. Next, the inter-layer film 16 is formed on the inter-layer insulation film 13 using silicon oxide, silicon nitride, or a photosensitive resin such as polyimide so that a film thickness is about 200 to 3000 [nm] according to a method such as a CVD method or a spin coating method. A laminated film formed of two or more kinds of films may be used in the inter-layer film 16. Next, the contact portion 18 including a contact hole penetrating through the inter-layer film 16 is formed through a patterning process. Next, a metal film is formed using a sputtering method or the like and the pixel electrode 17 is formed through a patterning process.

As described above, as in Example 1, the method of manufacturing the TFT structure according to Example 11 includes a process of forming the bottom gate electrode 81, a process of forming the polysilicon layer 61, the process of forming the gate insulation film 12 between both of the bottom gate electrode 81 and the polysilicon layer 61, and the process of forming the wire layer including the wires 14$_1$ and 14$_2$ and the inter-layer insulation film 13 on the polysilicon layer 61.

Further, the method includes the process of forming the inter-layer film 16 and the wire layer including the pixel electrode 17 on the wire layer including the wires 14$_1$ and 14$_2$. Then, lithography patterning is performed on the channel region 92 and the LDD regions 93$_1$ and 93$_2$ without depending on self-alignment from a bottom gate pattern, and the top gate electrode 95 is formed in the same layer as the wire layer including the wires 14$_1$ and 14$_2$ so that the channel region 92 is contained in a plan view.

Advantageous Effect

In the TFT structure according to Example 11, as in the TFT structure according to Example 1, it is possible to obtain an operational effect and advantageous effect such as separate generation of element characteristics between the TFTs 80 and 90 without adding a process, as in a case in which a method of changing density of ion implantation is used. Further, since a dummy gate electrode for forming the LDD regions 93$_1$ and 93$_2$ of the TFT 90 with the top gate structure is not necessary, it is possible to improve the degree of freedom of layout more than in the TFT structure including the dummy gate electrode 91 according to Example 1.

In Example 11, the TFTs 80 and 90 can be configured to be connected in series as in Example 2 or the TFTs 80 and 90 can also be configured to be connected in parallel as in Example 3.

<Electronic Apparatus>

The display device according to the above-described present disclosure can be used as any of display units (display devices) of electronic apparatuses in all fields that display video signal input to electronic apparatuses or video signals generated in electronic apparatuses as images or videos. For example, the display device can be used as any of display units of electronic apparatuses such as a television set, a digital camera, a note-type personal computer, a portable terminal apparatus such as a smartphone or a mobile phone, and a video camera.

In this way, by using the display device according to the present disclosure as a display unit of any of electronic apparatuses in any field, it is possible to obtain the following advantageous effects. That is, the element characteristics are able to be separately generated without adding processes according to the technology of the present disclosure. Therefore, it is possible to achieve an improvement in image-quality performance without increasing cost. In addition, since footprints can be reduced, it is possible to achieve miniaturization of an electronic apparatus.

The display device according to the present disclosure also has a module form configured to be sealed. For example, the module corresponds to a display module formed such that a facing unit such as a transparent glass is attached to a pixel array unit. In the display module, a circuit unit or a flexible printed circuit (FPC) that inputs and outputs signals or the like between the outside and the pixel array unit may be provided. Hereinafter, smartphones are exemplified as specific examples of an electronic apparatus using the display device according to the present disclosure. Here, the specific examples exemplified here are merely examples and the present disclosure is not limited thereto.

Specific Example

Figure 21A:
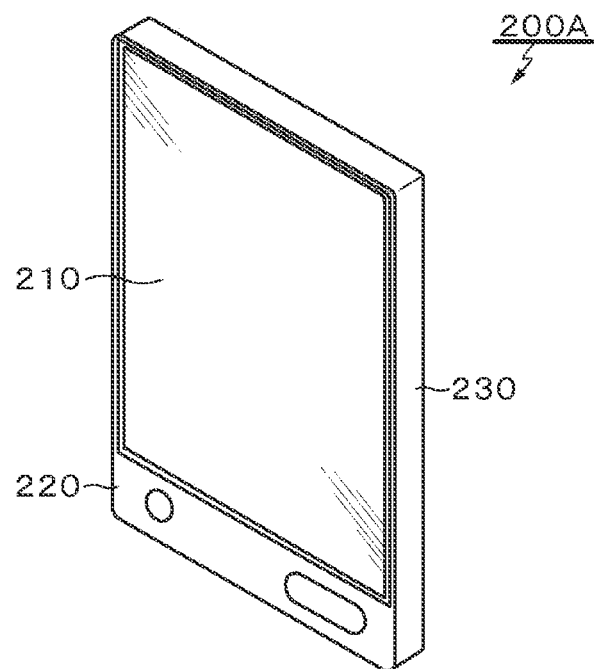
FIGS. 21A and 21B are external views showing smartphones which are examples of electronic apparatuses according to the present disclosure.
Figure 21B:
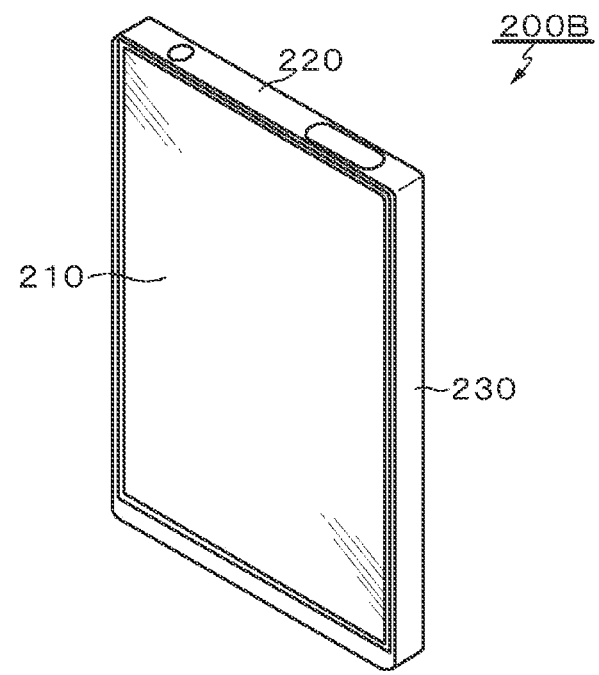

FIGS. 21A and 21B are external views showing smartphones which are examples of electronic apparatuses according to the present disclosure. Smartphones 200A and 200B each include a display unit 210 and a manipulation unit 220. In the case of the smartphone 200A shown in FIG. 21A, the manipulation unit 220 is provided below the display unit 210 of a casing 230. In the case of the smartphone 200B shown in FIG. 21B, the manipulation unit 220 is provided on an upper surface of the display unit 210 of a casing 230. The display device according to the present disclosure can be used as the display units 210 of the smartphones 200A and 200B. That is, the smartphones 200A and 200B according to the specific examples are manufactured using the display device according to the present disclosure as the display units 210.

As described above, by using the display device according to the present disclosure as the display units 210 of the smartphones 200A and 200B, the element characteristics are able to be separately generated without adding processes. Therefore, it is possible to achieve an improvement in image-quality performance without increasing cost. In addition, since footprints can be reduced, it is possible to achieve miniaturization of smartphones 200A and 200B.

Additionally, the present technology may also be configured as below.

[1]

A display device including:

a thin film transistor with a bottom gate structure and a thin film transistor with a top gate structure on a same substrate, wherein a top gate electrode of the thin film transistor with the top gate structure is provided in a same layer as a wire layer.

[2]

The display device according to [1], wherein the top gate electrode of the thin film transistor with the top gate structure is integrated by extending from a wire electrically connected to a source or drain region of the thin film transistor of the bottom gate structure.

[3]

The display device according to [1] or [2], wherein the thin film transistor with the top gate structure includes a dummy gate electrode in a floating state.

[4]

The display device according to any of [1] to [3], wherein the wire layer in which the top gate structure is provided is a first wire layer provided on an inter-layer insulation film on the thin film transistor.

[5]

The display device according to any of [1] to [4], wherein a first wire layer is provided on an inter-layer insulation film on the thin film transistor and a first inter-layer film is provided on the first wire layer, and the wire layer in which the top gate structure is provided is a second wire layer provided on the first inter-layer film.

[6]
The display device according to [5],
wherein a contact hole is formed in a site of the inter-layer insulation film corresponding to a channel region of the thin film transistor with the top gate structure, and
a gate insulation film is provided on the inter-layer insulation film containing the contact hole.

[7]
The display device according to [6],
wherein the gate insulation film is constituted by a high dielectric inter-layer film.

[8]
The display device according to [6] or [7],
wherein the contact hole is formed in a site of the first inter-layer film corresponding to the thin film transistor with the top gate structure, and
the top gate electrode of the thin film transistor with the top gate structure is provided in a same layer as a second wire layer on the first inter-layer film, in the contact hole, and on the gate insulation film.

[9]
The display device according to [8],
wherein the top gate electrode of the thin film transistor with the top gate structure is disposed to face a channel region of the thin film transistor via the gate insulation film constituted by a high dielectric inter-layer film.

[10]
The display device according to any of [1] to [9],
wherein the thin film transistor with the bottom gate structure and the thin film transistor with the top gate structure are connected in series for use.

[11]
The display device according to any of [1] to [9],
wherein the thin film transistor with the bottom gate structure and the thin film transistor with the top gate structure are connected in parallel for use.

[12]
The display device according to [10] or [11],
wherein a source or drain region of the thin film transistor with the bottom gate structure is connected directly to a source or drain region of the thin film transistor with the top gate structure without passing through a wire layer.

[13]
The display device according to any of [10] to [12],
wherein a bottom gate electrode of the thin film transistor with the bottom gate structure and the top gate electrode of the thin film transistor with the top gate structure have a same potential.

[14]
The display device according to any of [1] to [13],
wherein a unit pixel including a light emission unit is disposed to be constituted, and
the unit pixel includes a writing transistor that writes a signal and a drive transistor that drives the light emission unit based on the signal written by the writing transistor,
wherein the writing transistor is constituted by the thin film transistor with the bottom gate structure, and
the drive transistor is constituted by the thin film transistor with the top gate structure.

[15]
A method of manufacturing a display device that includes a thin film transistor with a bottom gate structure and a thin film transistor with a top gate structure on a same substrate, the method including:
forming a top gate electrode of the thin film transistor with the top gate structure in a same layer as a wire layer.

[16]
A method of manufacturing a display device, the method including:
performing an array test to determine element characteristics of an individual thin film transistor in a step of forming a thin film transistor with a bottom gate structure; and
forming a top gate electrode in a same layer as a wire layer in regard to the thin film transistor with the bottom gate structure in order to repair a pixel including a thin film transistor determined to be worse than predetermined characteristics.

[17]
The method of manufacturing a display device according to [16],
wherein the top gate electrode is formed using a method of connecting a wire by forming a metal thin film in accordance with a CVD method.

[18]
The method of manufacturing a display device according to [16] or [17],
wherein the thin film transistor in which the top gate electrode is formed is a repairing target thin film transistor determined to be worse than predetermined characteristics, and
the top gate electrodes is formed to face a bottom gate electrode of the repairing target thin film transistor with a channel region interposed therebetween.

[19]
The method of manufacturing a display device according to [16] or [17],
wherein the thin film transistor in which the top gate electrode is formed is another thin film transistor that is provided on a same substrate as a repairing target thin film transistor determined to be worse than predetermined characteristics and connected in parallel to the repairing target thin film transistor, and
the top gate electrodes is disposed to face a bottom gate electrode of the other thin film transistor with a channel region interposed therebetween.

[20]
An electronic apparatus including:
a display device which includes a thin film transistor with a bottom gate structure and a thin film transistor with a top gate structure on a same substrate and in which a top gate electrode of the thin film transistor with the top gate structure is provided in a same layer as a wire layer.

REFERENCE SIGNS LIST 10 organic EL display device
11 glass substrate
12 gate insulation film
13 inter-layer insulation film
$14_1$ to $14_4$ wires of first wire layer
$15_1$ to $15_4$, 18, $19_0$, $19_{-1}$, $19_{-2}$ contact portions
16 first inter-layer film
16A, 16B contact hole
17 pixel electrode
20 unit pixel (pixel circuit)
21 organic EL element
22 drive transistor
23 writing transistor
24 retention capacitor 25 auxiliary capacitor
pixel array unit
31 ($31_1$ to $31_m$) scanning lines
32 ($32_1$ to $32_m$) power supply lines
33 ($33_1$ to $33_n$) signal lines
34 common power supply line
40 write scanning line
50 power supply scanning unit
$51_1$ to $51_4$ wires of second wire layer
52 gate insulation film
52A contact hole
53 second inter-layer film
$54_1$ to $54_3$ contact portions
60 signal output unit
61 polysilicon layer
62 photoresist
70 display panel
80 TFT with bottom gate structure
81, 91' bottom gate electrode
82 channel region
$83_1$, $83_2$ LDD region
$84_1$, $84_2$ source or drain region
85 top gate electrode
90 TFT with top gate structure
91 dummy gate electrode
92 channel region
$93_1$, $93_2$ LDD region
$94_1$, $94_2$ source or drain region
95 top gate electrode

The invention claimed is:

1. A display device comprising:

a substrate; and a plurality of pixels arranged on the substrate, respective ones of the plurality of pixels including a light emitting element, a driving transistor, a sampling transistor, and a capacitor, wherein the light emitting element includes a first electrode, an organic layer disposed on the first electrode, and a second electrode disposed on the organic layer, the driving transistor includes a first gate electrode disposed over a channel region, a first source or drain region, a second source or drain region, and a metal layer being disposed under the channel region, the sampling transistor includes a second gate electrode, a third source or drain region, and a fourth source or drain region, and the third source or drain region of the sampling transistor is electrically connected to the gate electrode of the driving transistor.

2. The display device according to claim 1, wherein the first source or drain region and the second source or drain region are formed in a first semiconductor layer, the third source or drain region and the fourth source a drain region are formed in a second semiconductor layer, and the first semiconductor layer is distinct from the second semiconductor layer.

3. The display device according to claim 2, wherein the second gate electrode of the sampling transistor is disposed under a channel region.

4. The display device according to claim 3, wherein the metal layer is a dummy gate electrode.

5. The display device according to claim 1, wherein the second gate electrode of the sampling transistor is disposed under a channel region.

6. The display device according to claim 1, wherein the metal layer is a dummy gate electrode.

7. An electronic apparatus comprising the display device according to claim 1.

8. The electronic apparatus according to claim 7, wherein the first source or drain region and the second source or drain region are formed in a first semiconductor layer, the third source or drain region and the fourth source a drain region are formed in a second semiconductor layer, and the first semiconductor layer is distinct from the second semiconductor layer.

9. The electronic apparatus according to claim 8, wherein the second gate electrode of the sampling transistor is disposed under a channel region.

10. The electronic apparatus according to claim 9, wherein the metal layer is a dummy gate electrode.

11. The electronic apparatus according to claim 7, wherein the second gate electrode of the sampling transistor is disposed under a channel region.

12. The electronic apparatus according to claim 7, wherein the metal layer is a dummy gate electrode.

* * * * *